(12) United States Patent
Bulja et al.

(10) Patent No.: US 11,678,582 B2
(45) Date of Patent: Jun. 13, 2023

(54) ELECTROACTIVE MATERIAL-CONTROLLED SMART SURFACE

(71) Applicant: Nokia Technologies OY, Espoo (FI)

(72) Inventors: Senad Bulja, Dublin (IE); Dirk Wiegner, Schwaikheim (DE); Wolfgang Templ, Sersheim (DE); Rose F Kopf, Green Brook, NJ (US)

(73) Assignee: Nokia Technologies Oy, Espoo (FI)

( * ) Notice: Subject to any disclaimer, the term of this patent is extended or adjusted under 35 U.S.C. 154(b) by 473 days.

(21) Appl. No.: 16/837,717

(22) Filed: Apr. 1, 2020

(65) Prior Publication Data

US 2021/0313390 A1 Oct. 7, 2021

(51) Int. Cl.

| | |
|---|---|
| *H01L 41/47* | (2013.01) |
| *H01L 27/20* | (2006.01) |
| *H01L 41/04* | (2006.01) |
| *H01L 41/047* | (2006.01) |
| *H01L 41/09* | (2006.01) |
| *H01L 41/193* | (2006.01) |
| *G06F 17/14* | (2006.01) |

(52) U.S. Cl.
CPC ............ *H01L 27/20* (2013.01); *H01L 41/042* (2013.01); *H01L 41/0475* (2013.01); *H01L 41/0986* (2013.01); *H01L 41/193* (2013.01); *G06F 17/14* (2013.01)

(58) Field of Classification Search
CPC .............. H01P 1/10; H01P 1/11; H01P 1/181; H01Q 15/002; H01Q 15/0086; H01Q 15/10; H03B 5/1293; C09K 2219/11; H01L 27/20; H01L 41/042; H01L 41/0475; H01L 41/0986; H01L 41/193; H01L 41/04; H01L 41/083; G06F 17/14
See application file for complete search history.

(56) References Cited

U.S. PATENT DOCUMENTS

| | | | |
|---|---|---|---|
| 7,369,396 B2* | 5/2008 | Maliakal ............... | B81B 3/0021 361/311 |
| 10,775,850 B2* | 9/2020 | Wang ..................... | H03K 17/96 |
| 11,139,544 B2* | 10/2021 | Wiegner ............... | H01P 1/2039 |
| 11,264,720 B2* | 3/2022 | Wiegner ............. | H01P 1/20345 |
| 2003/0222945 A1* | 12/2003 | Nagata ................... | B41J 2/1631 347/68 |
| 2012/0105333 A1* | 5/2012 | Maschmeyer .......... | G06F 3/016 345/173 |
| 2013/0215079 A1* | 8/2013 | Johnson ................. | G06F 3/016 345/174 |
| 2015/0048714 A1* | 2/2015 | Ng ....................... | H01L 41/0933 310/300 |
| 2019/0050102 A1* | 2/2019 | Johnson .............. | G06F 3/04144 |
| 2020/0251647 A1* | 8/2020 | Pelssers ................ | C08L 101/12 |
| 2021/0063833 A1* | 3/2021 | Bulja ................... | H03B 5/1293 |
| 2021/0066574 A1* | 3/2021 | Diest ...................... | H01L 41/45 |
| 2021/0124231 A1* | 4/2021 | Wiegner ............. | H01Q 9/0414 |
| 2021/0278740 A1* | 9/2021 | Johnson .............. | G02B 26/108 |
| 2021/0282712 A1* | 9/2021 | Hilgers ............. | A61B 5/02422 |

(Continued)

*Primary Examiner* — Jarrett J Stark

(74) *Attorney, Agent, or Firm* — Harness, Dickey & Pierce, P.L.C.

(57) ABSTRACT

An apparatus includes a dielectric tile array including a plurality of dielectric tiles; and a plurality of electroactive (EA) material blocks configured to expand or contract in response to being actuated by the application of an actuation voltage.

20 Claims, 17 Drawing Sheets

(56) References Cited

U.S. PATENT DOCUMENTS

| | | | | |
|---|---|---|---|---|
| 2021/0313390 A1* | 10/2021 | Bulja | ................... | H01L 41/0986 |
| 2021/0335634 A1* | 10/2021 | Fang | ................... | H01L 27/1218 |
| 2022/0131251 A1* | 4/2022 | Wiegner | ................... | H01P 5/16 |

* cited by examiner (a)

(b)

(c)

200

500

Output EM wave

Input EM wave           (a)

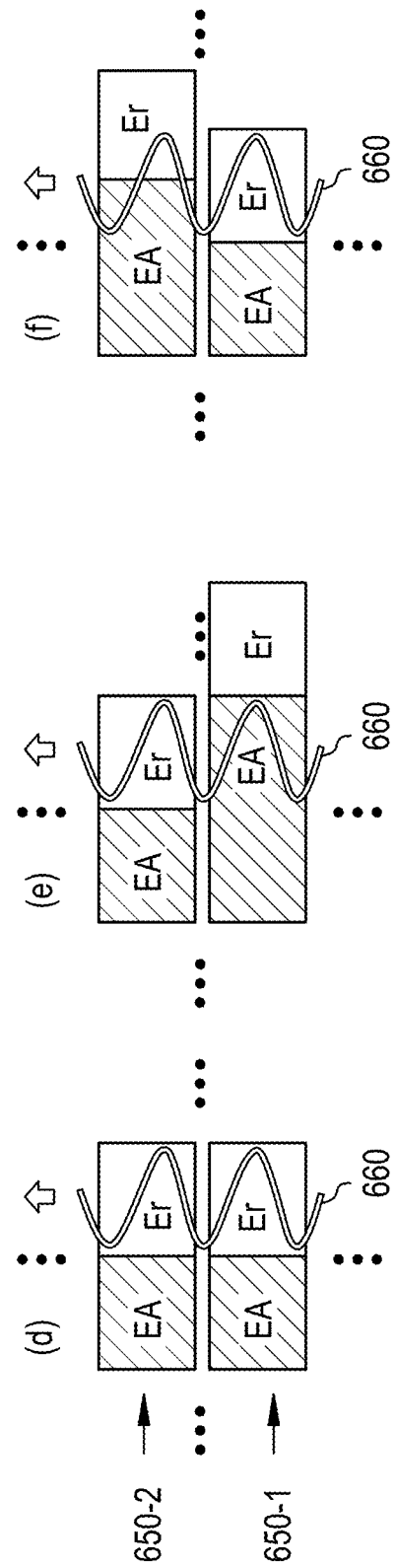

(a)

(b)

(c)

ELECTROACTIVE MATERIAL-CONTROLLED SMART SURFACE

TECHNICAL FIELD

One or more example embodiments relate to signal processing and, more specifically, to analog and programmable computers operating on wireless signals.

BACKGROUND

Digital computation has been in widespread use ever since the invention of the transistor. Humanity in its endeavor to understand and quantify nature used language of mathematics. Especially fruitful was use of algebra were phenomena are described by an equation. Although, the equation introduces elegant description of the problem and gives qualitative insight in the phenomena, it is often not tractable by a direct analytic approach. To circumvent the above difficulty the idea of problem discretization was born. Complex problems occurring in nature and epitomized using sets of equations (differential, integral and transcendent, to name but a few) were possible to be solved by domain discretization—rather than solving the equation itself, the equation to be solved is represented by a set of simplified equations over a specific region. This set of equations is easily representable in the digitalized fashion, where the solution can be found using transistor logic.

SUMMARY

The scope of protection sought for various example embodiments of the invention is set out by the independent claims. The example embodiments and features, if any, described in this specification that do not fall under the scope of the independent claims are to be interpreted as examples useful for understanding various example embodiments of the invention.

According to at least some example embodiments, an apparatus includes a dielectric tile array including a plurality of dielectric tiles; and a plurality of electroactive (EA) material blocks configured to expand or contract in response to being actuated by the application of an actuation voltage.

The apparatus may further include a plurality of bias plates, wherein, for each EA material block among the plurality of EA material blocks, two bias plates among the plurality of bias plates are affixed to two opposite sides the EA material block, respectively.

For each EA material block among the plurality of EA material blocks, at least one of the two bias plates may be affixed to the EA material block is affixed to a side of a dielectric tile from among the plurality of dielectric tiles.

The apparatus may further include a plurality of sliding contacts, wherein, for each EA material block among the plurality of EA material blocks, two sliding contacts from among the plurality of sliding contacts may be affixed, respectively, to the two bias plates that are affixed the EA material block.

The apparatus may further include a plurality of bias line pairs, wherein, for each EA material block among the plurality of EA material blocks, the two sliding contacts connected to the EA material block via the two bias plates affixed to the EA material block may contact the two bias lines of a bias line pair from among the plurality of bias line pairs.

For each EA material block among the plurality of EA material blocks, the two bias lines contacting the two sliding contacts connected to the EA material block via the two bias plates affixed to the EA material block may be configured to supply the actuation voltage to the EA material block.

At least a first EA material block from among the plurality of EA material blocks may be configured such that, in response to the application of the actuation voltage to the first EA material block, the EA material block expands or contracts such that a distance between the two bias plates affixed to the first EA material block increases or decreases.

At least the first EA material block may be further configured such that, in response to the application of the actuation voltage to the first EA material block, the EA material block expands or contracts such that the dielectric tile affixed to at least one of the bias plates affixed to the first EA material block changes position relative to the two bias lines contacting the two sliding contacts connected to the first EA material block via the two bias plates affixed to the first EA material block.

According to at least some example embodiments, a multi-surface structure includes a plurality of smart surface layers stacked on each other, each smart surface layer including a dielectric tile array including a plurality of dielectric tiles; and a plurality of electroactive (EA) material blocks configured to expand or contract in response to being actuated by the application of an actuation voltage.

The multi-surface structure may further include control circuitry configured to control the plurality of smart surface layers.

The control circuitry may be configured to control the plurality of smart surface layers to perform a first signal processing operation on an electromagnetic (EM) wave that impinges the plurality of smart surface layers.

The first signal processing operation may be a differentiation operation or an integration operation.

The control circuitry may be configured to control the plurality of smart surface layers to perform the first signal processing operation by selectively actuating EA material blocks selected from among the plurality of EA material blocks of one or more of the plurality of smart surface layers.

The control circuitry may be configured to selectively actuate the selected EA material blocks by selectively applying bias voltages to the selected EA material blocks.

The control circuitry may be configured to control the plurality of smart surface layers in accordance with a virtual segmentation of one or more of the plurality of smart surfaces such that the plurality of smart surfaces performs parallel individual processing of several spatially separated EM waves that impinge the plurality of smart surface layers.

The multi-surface structure may further include a plurality of bias plates, wherein, for each EA material block among the plurality of EA material blocks of at least one smart surface layer from among the plurality of smart surface layers, two bias plates among the plurality of bias plates are affixed to two opposite sides the EA material block, respectively.

For each EA material block among the plurality of EA material blocks of the at least one smart surface layer, at least one of the two bias plates affixed to the EA material block may be affixed to a side of a dielectric tile from among the plurality of dielectric tiles of the at least one smart surface layer.

The multi-surface structure may further include a plurality of sliding contacts, wherein, for each EA material block among the plurality of EA material blocks of the at least one smart surface layer, two sliding contacts from among the plurality of sliding contacts are affixed, respectively, to the two bias plates that are affixed the EA material block.

The multi-surface structure may further include a plurality of bias line pairs, wherein, for each EA material block among the plurality of EA material blocks of the at least one smart surface layer, the two sliding contacts connected to the EA material block via the two bias plates affixed to the EA material block contact the two bias lines of a bias line pair from among the plurality of bias line pairs.

For each EA material block among the plurality of EA material blocks of the at least one smart surface layer, the two bias lines contacting the two sliding contacts connected to the EA material block via the two bias plates affixed to the EA material block may be configured to supply the actuation voltage to the EA material block.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of this disclosure.

FIG. 6C is a diagram for explaining weighting of a dielectric constant of an EA-controlled smart surface or an EA-controlled multi-surface structure in a horizontal direction.

DETAILED DESCRIPTION

Figure 1:
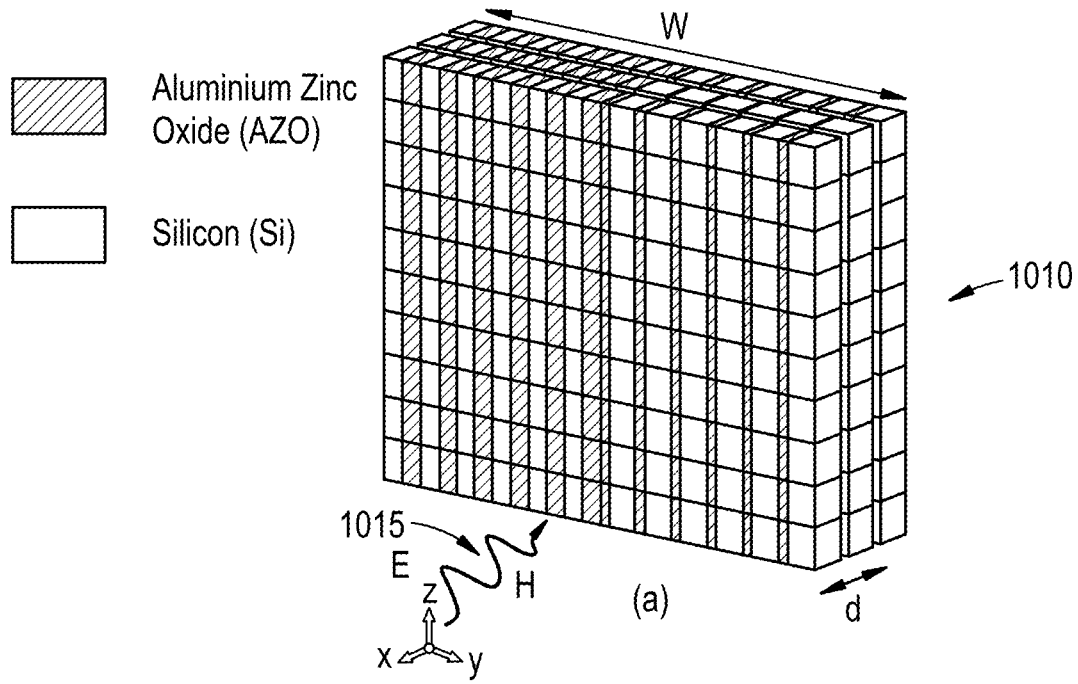
FIG. 1 is a diagram for explaining an example metasurface.
Figure 1:
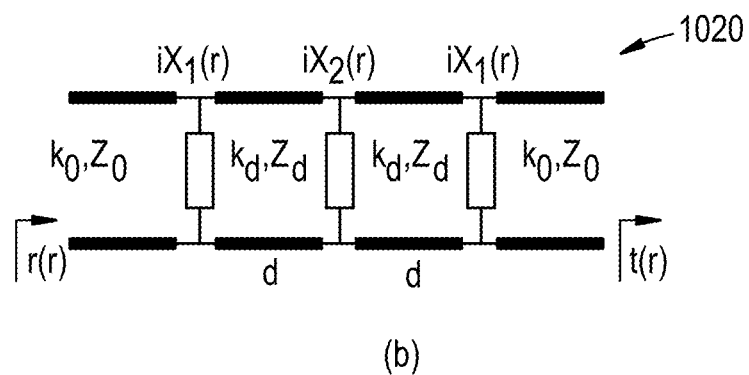
Figure 1:
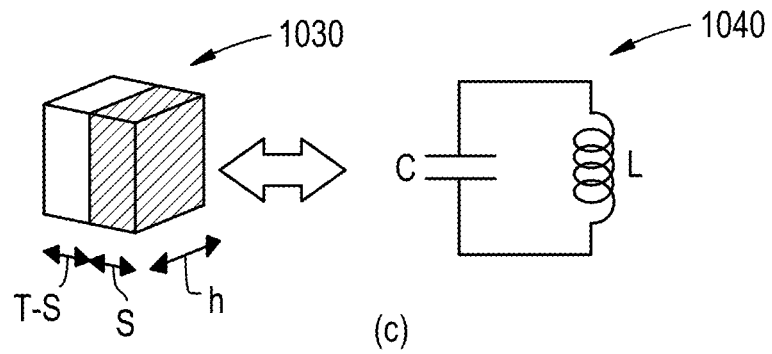

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

It should be understood that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

While one or more example embodiments may be described from the perspective of a radio network element or radio access network (RAN) element (e.g., a base station, eNB, next generation Node B (gNB), Central Unit (CU), ng-eNB, etc.), user equipment (UE), or the like, it should be understood that one or more example embodiments discussed herein may be performed by the one or more processors (or processing circuitry) at the applicable device or network element. For example, according to one or more example embodiments, at least one memory may include or store computer program code, and the at least one memory and the computer program code may be configured to, with at least one processor, cause a network node to perform the operations discussed herein. As discussed herein, UE and User may be used interchangeably.

It will be appreciated that a number of example embodiments may be used in combination.

As is noted above, using discretization, complex problems that occur in nature and may be represented by a set of simplified equations over a specific region. This set of equations may be easily representable in the digitalized fashion, where the solution can be found using transistor logic. Depending on the granularity of the solution (accuracy over a specified region), the solution to a specified equation can require a large amount of transistors. For decades, digital computation has benefited from Moore's law, which states that the number of transistors doubles every two years, meaning that better accuracies were possible using more transistors, packed in a smaller area. However, Moore's law does not and cannot extend indefinitely—at some point the size of the transistor will become comparable to the critical dimensions of atoms, which imposes hard limits. This is known as atomic computing, which is a research area in its infancy. Effectively, atomic computing relies on the atomic states to perform mathematical functions, which on a macro level can be interpreted as basic mathematical manipulations.

In any scientific field, equations arise from the interpretation of naturally occurring phenomena—in the case of Electro-Magnetics (EM), equations are either the consequence of current distribution on conductive surfaces or EM fields propagating/non-propagating in media. Nature itself is analog at our macro level hence analog computation will always be more energy efficient then its digital counterpart. From this point of view digital computing is rather inefficient—it relies on the conversion of the problem from its natural domain (in the present case, EM) to a set of discretized equations to be solved and the subsequent up-conversion of the solution so that it is representable in the way the user desires.

Thus, it would be beneficial to provide a solution that facilitates computing in the native domains from which the equations describing underlying phenomena arise.

Accordingly, at least some example embodiments of the present disclosure are directed to an electroactive (EA)-controlled smart surface that is similar (or alternatively, equivalent) to an analog computer, and is capable of performing a variety of mathematical operations (i.e. solving equations) in the inherent, natural domain from which these equations arose—in the present case wireless signals.

An example metasurface structure will be discussed below with reference to FIG. 1. An EA-controlled smart surface according to at least some example embodiments will be discussed below with reference to FIGS. 2A-5B Example Metasurface Structure FIG. 1 is a diagram for explaining an example metasurface structure. Item (a) in FIG. 1 illustrates a metasurface structure 1010 for performing a mathematical structure. In the example illustrated in FIG. 1, the metasurface structure 1010 includes three metasurface layers which are stacked on each other in a direction parallel to the x-axis. Item (b) in FIG. 1 is a circuit diagram of an equivalent circuit 1020 of the metasurface structure 1010. Here, r(r) refers to for the reflection coefficient as distance (vector r), t(r) refers to the transmission coefficient as a function of distance (same as above, vector r), $iX_1(r)$ and $iX_2(r)$ refer to reactances (i.e., an imaginary part of impedance) as a function of distance (vector r). Parameter Zo refers to the characteristic impedance of the medium from which the EM wave is travelling (e.g., typically air), while parameter $k_0$ refers to the wavevector associated the propagation environment of the mentioned propagating wave. The wavevector $k_0$ is given by $$k_0 = \frac{2\pi}{\lambda_0},$$

where parameter $\lambda_0$ is the wavelength given by $$\lambda_0 = \frac{c}{f},$$

where c is the velocity of light and f is the frequency at which the wavevector is sought. In a similar way, parameter $Z_d$ represents the characteristic impedance of the medium shown by 1010 in item (a) of FIG. 1 and is responsible for performing the mathematical manipulation. In the example shown at item (b) in FIG. 1, the medium is composed of unit cells 1030 illustrated by item (c) of FIG. 1. Further, the parameter d refers to dilation of effective impedances. The wavevector $k_d$ in this case is given by $k_d = k_0\sqrt{\varepsilon_r(r)}$, where parameter $\varepsilon_r(r)$ represents the relative dielectric permittivity of the medium 1010 of item (c) of FIG. 1 as a function of the position vector, r.

In the example illustrated in FIG. 1, each of the three metasurface layers of the metasurface structure 1010 includes Aluminum Zinc Oxide (AZO) and Silicon (Si) layers as stacked on each other in a direction parallel to the y axis. For example, item (c) in FIG. 1 illustrates an example of an individual cell 1030 of a metasurface layer of the metasurface structure 1010 and an equivalent circuit 1040 of the individual cell 1030. The equivalent circuit 1020 pertains to the almost-visible light (optical) frequencies (100 THz), where the wavelength is about $\lambda_0=3$ μm. The individual cell 1030 has a lateral length h and a total thickness T. The parameter S indicates a thickness of the AZO portion of the individual cell 1030. At optical frequencies, the AZO part exhibits a plasmonic behavior, characterized by a negative dielectric constant. The negative dielectric constant gives rise to the interpretation of the AZO part as an inductor L. The Si part of the circuit behaves as a capacitor C. By stacking of the individual metasurface layers (3 in this case) it is possible to obtain the condition of zero reflection, r=0 and $t=e^{j\Phi(x)}$, where Φ(x) is the desired phase function in the x-dimension, for example, with respect to an input signal 1015 having an electric field component E and a magnetic field component H. The phase function, Φ(x) is directly proportional to the profile of the equivalent dielectric permittivity.

Let us now assume that a plane wave (e.g., input signal 1015), linearly polarized along the z axis, propagating in the negative x-direction impinges on the composite surface of metasurface structure 1010. Let us denote this signal with f(y). The signal that emerges at the output of the metasurface 1010 can be represented with a convolution integral in accordance with Expression (1):

$$g(y)=\int f(u)G(y-u)du. \tag{1}$$

Converting (1) to the Fourier domain yields Expression (2):

$$\tilde{g}(k_y)=\tilde{G}(k_y)\tilde{f}(k_y). \tag{2}$$

Where g(y) and $G(k_y)$ are the spatial impulse response of the impinged upon surface of the metasurface structure 1010 and the Fourier equivalent of the impinged upon surface, respectively. The variable $k_y$ in (2) is a new Fourier variable, which in the spatial domain corresponds to y. Hence, expression (2) can be rewritten as Expression (3):

$$\tilde{g}(y)=\tilde{G}(y)\tilde{f}(y). \tag{3}$$

Equation (3) shows how the output signal is modified by the meta-surface of FIG. 1. By an appropriate choice of the G(y) parameter it is possible to manipulate the output signal in accordance with a predefined mathematical function. Some examples:

1. Differentiation: In the Fourier domain, differentiation of the nth order is equivalent to the multiplication with $(i*y)^n$. Given the fact that the metasurface structure 1010 of FIG. 1 is dimensionally limited in the y direction by limits +/−W/2, the differentiation of the $n^{th}$ order can be represented as $\sim G(y)=(j*y/(W/2))^n$. The addition of the normalizing width W/2 is needed in order to avoid the creation of gain media.

2. Integration: Multiple, $n^{th}$ order integration in the Fourier domain is equivalent to the multiplication by a factor of $G(y)=(d/(j*y))^n$. Just like in the case of differentiation, this factor needs to be modified by the normalization with certain parameter, which will limit the integration factor to +/−1(i).

An example differentiation operation using the metasurface structure 1010 will now be described.

The propagation of any wave through any media, provided that there are no reflections can be written as Expression (4):

$$t = e^{jk\Delta}. \tag{4}$$

By assuming no reflections at the boundary, the propagation constant k can be written as Expression (5):

$$k = k_0 \varepsilon_r(y). \tag{5}$$

By equating Expression (4) with G(y)=(j*y/(W/2)), one obtains the expression for the transverse profile of the dielectric permittivity, $\varepsilon_r(y)$, Expression (6)

$$\varepsilon_r(y) = \frac{1}{jk_0\Delta}\ln\left(j\frac{2y}{W}\right). \tag{6}$$

Expression (6) can be realized using the meta-surface of FIG. 1.

There are several drawbacks to the approach described above with reference to FIG. 1. For example, the idea is only realizable at optical frequencies, where plasmonic effects take place and the dielectric permittivity can be assumed to be negative. Additionally, the metasurface structure 1010 of FIG. 1 is not tunable—i.e. once the metasurface structure 1010 is designed to perform integration—it will only do integration. Further, in general, the metasurface structure 1010 works only on linearly polarized waves.

The mathematical principles outlined above form the basis for the creation of what is called a "smart surface". In the example illustrated in FIG. 1, one is generally able to perform the above-referenced mathematical operations (e.g., differentiation) only at extremely high frequencies (e.g., order of hundreds of terahertz (THz)). Additionally, a smart surface obtained in this way is not tuneable. In other words, if the smart surface is designated to operate as a differential operator, the function of the smart surface cannot be reconfigured once the hardware is fabricated.

An EA-controlled smart surface according to at least some example embodiments addresses issues discussed above with respect to the metasurface structure 1010. For example, the EA-controlled smart surface according to at least some example embodiments facilitates the provision of a platform that will allow almost arbitrary computations to take place at much lower frequencies. This becomes extremely important as radio-based communications networks move towards 5G and beyond, operating at frequencies of 10s and 100s of GHz. According to at least some example embodiments, EA-controlled smart surfaces will allow mathematical operations to be performed in the native domain of the signals upon which the operations are performed, without the need of down-conversion and subsequent signal processing, thus resulting in very efficient computing. EA-controlled smart surfaces according to at least some example embodiments will now be discussed below with reference to FIGS. 2A-5B.

EA-Controlled Smart Surfaces

The EA-controlled smart surface according to at least some example embodiments is a surface that may provide: the ability to operate at radio frequency (RF) and millimeter (mm)-wave frequencies (5G); surface tunability; and the ability to operation on several (or, alternatively, all) polarizations of incident waves.

Figure 2A:
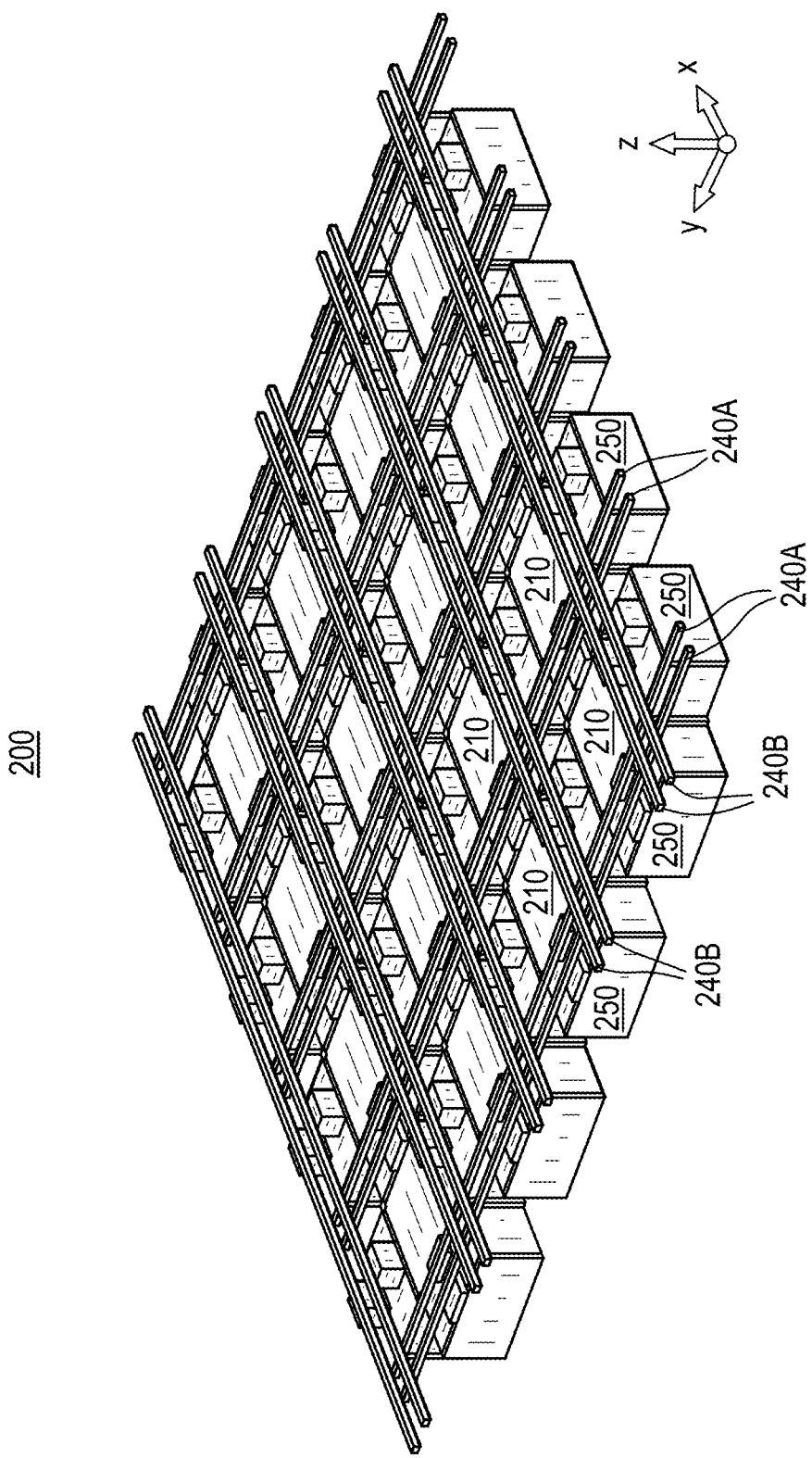
FIG. 2A illustrates a perspective view of an electroactive (EA)-controlled smart surface according to at least some example embodiments.
Figure 2B:
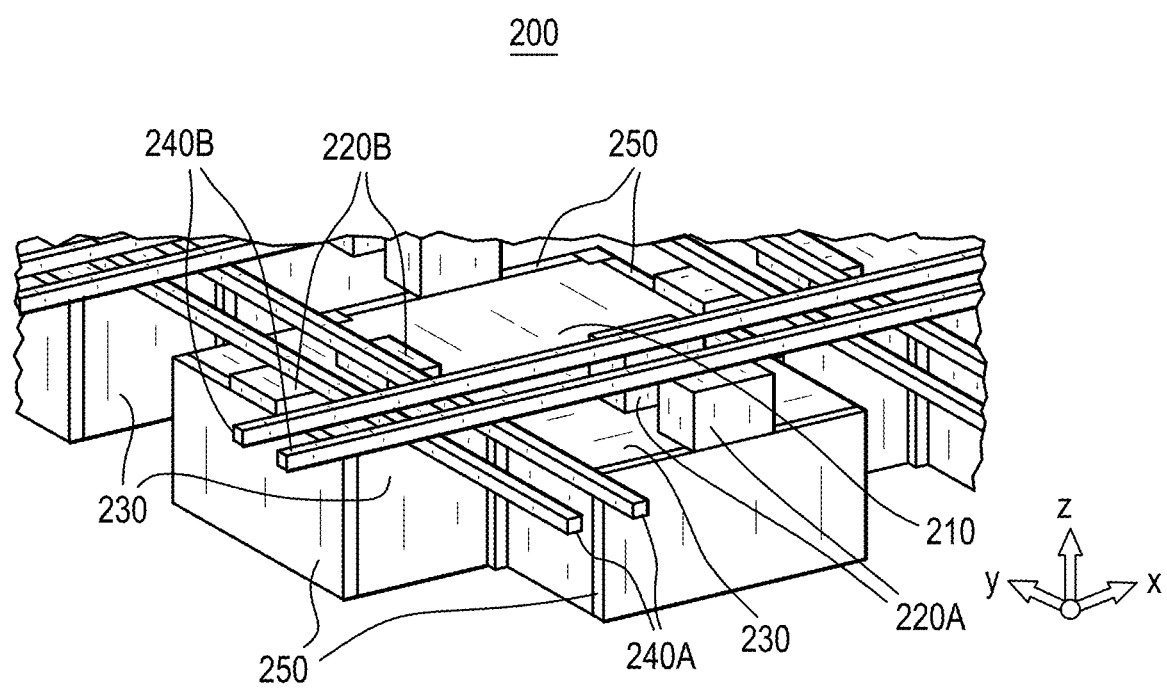
FIG. 2B illustrates a perspective view of the EA-controlled smart surface of FIG. 2A which is zoomed-in relative to the view in FIG. 2B according to at least some example embodiments.
Figure 2C:
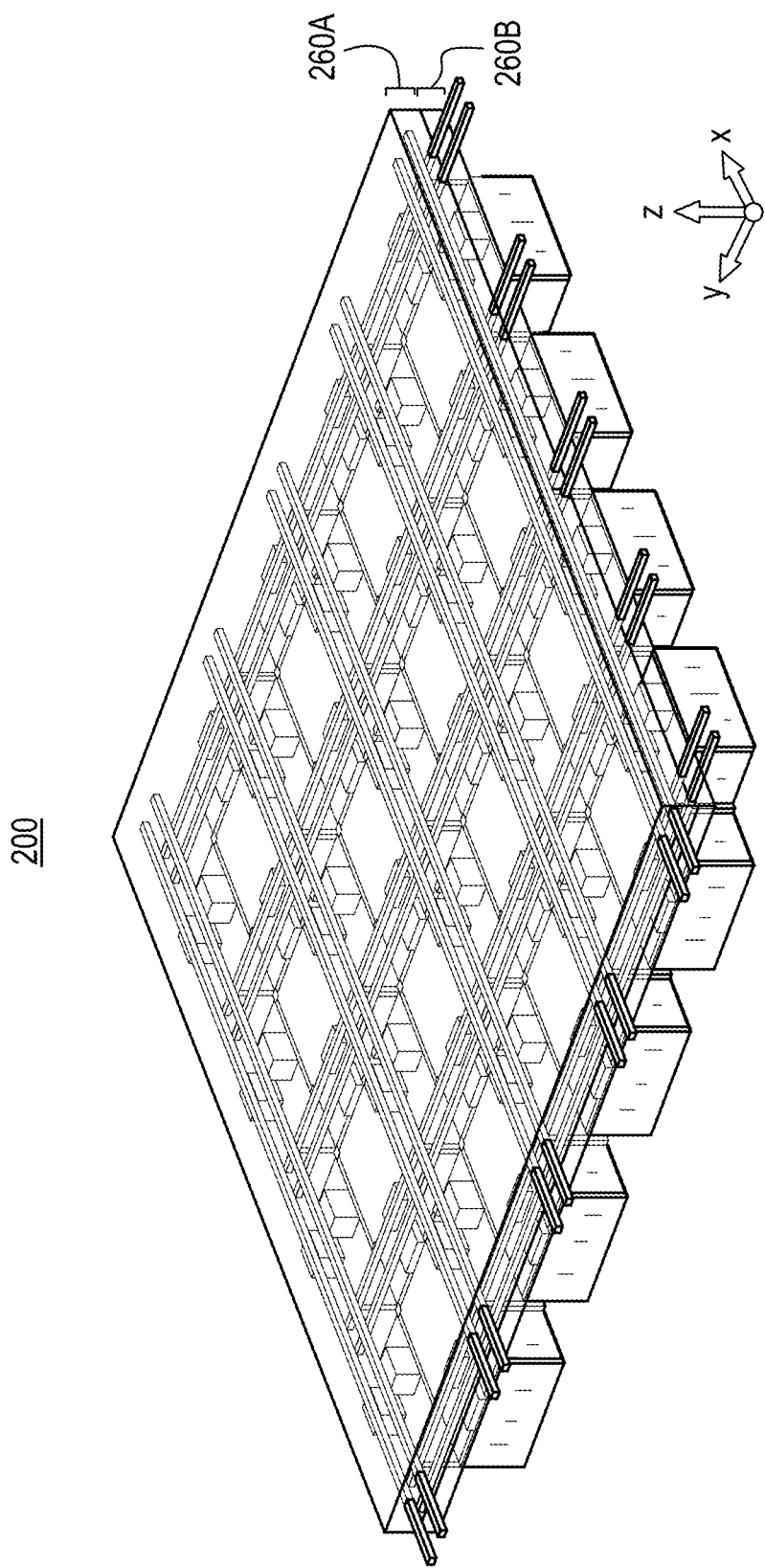
FIG. 2C illustrates first and second dielectric layers of the EA-controlled smart surface of FIG. 2A with reference to a perspective view of the EA-controlled smart surface of FIG. 2A according to at least some example embodiments.
Figure 2D:
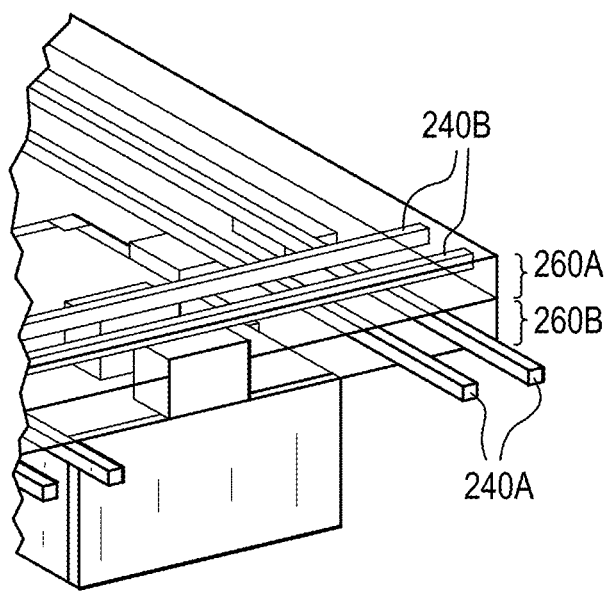
FIG. 2D illustrates first and second dielectric layers of the EA-controlled smart surface of FIG. 2A with reference to a perspective view of the EA-controlled smart surface of FIG. 2A that is zoomed-in relative to the view of FIG. 2C according to at least some example embodiments.
Figure 3A:
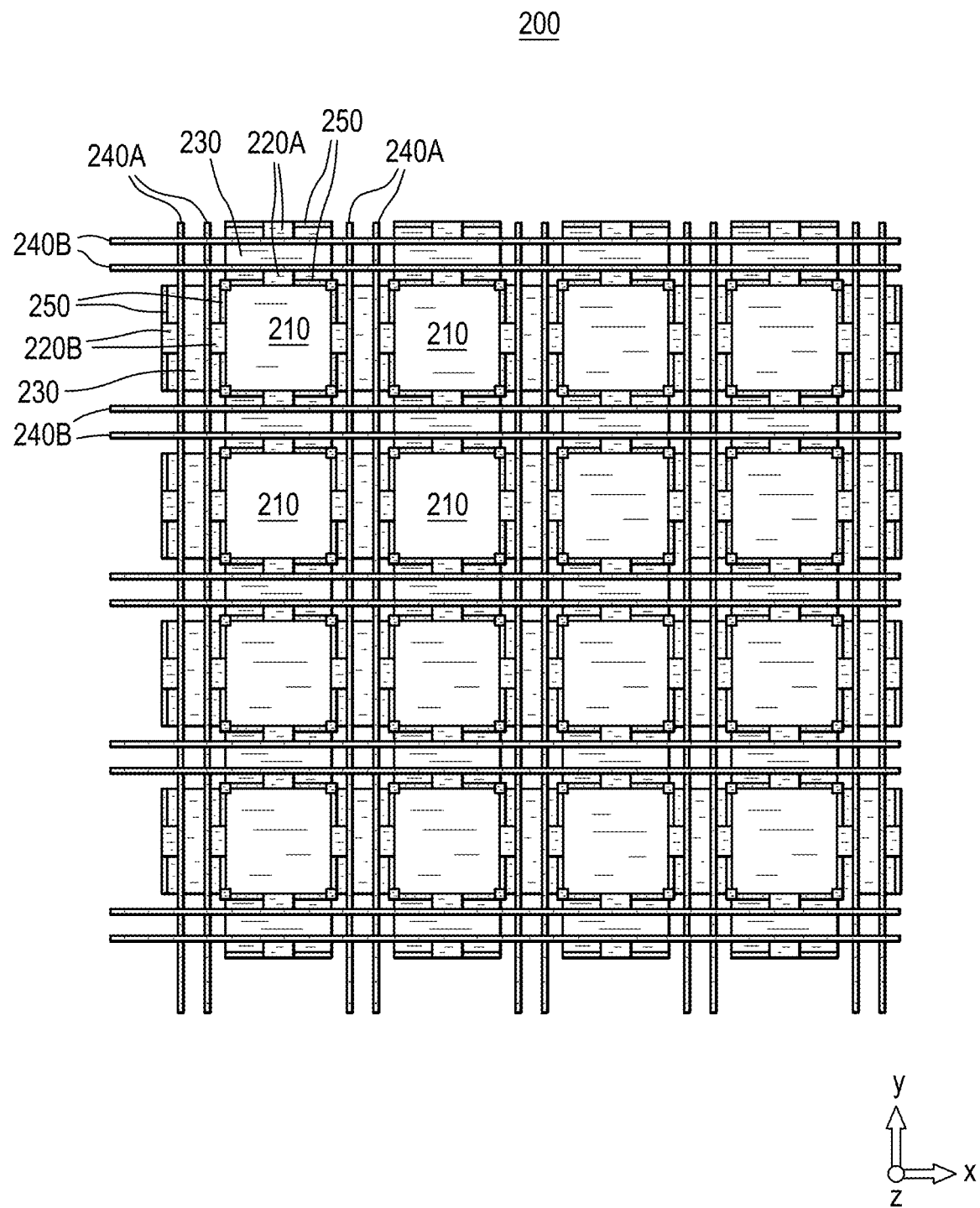
FIG. 3A illustrates a plan view of the EA-controlled smart surface of FIG. 2A with respect to a view position above the EA-controlled smart surface according to at least some example embodiments.
Figure 3B:
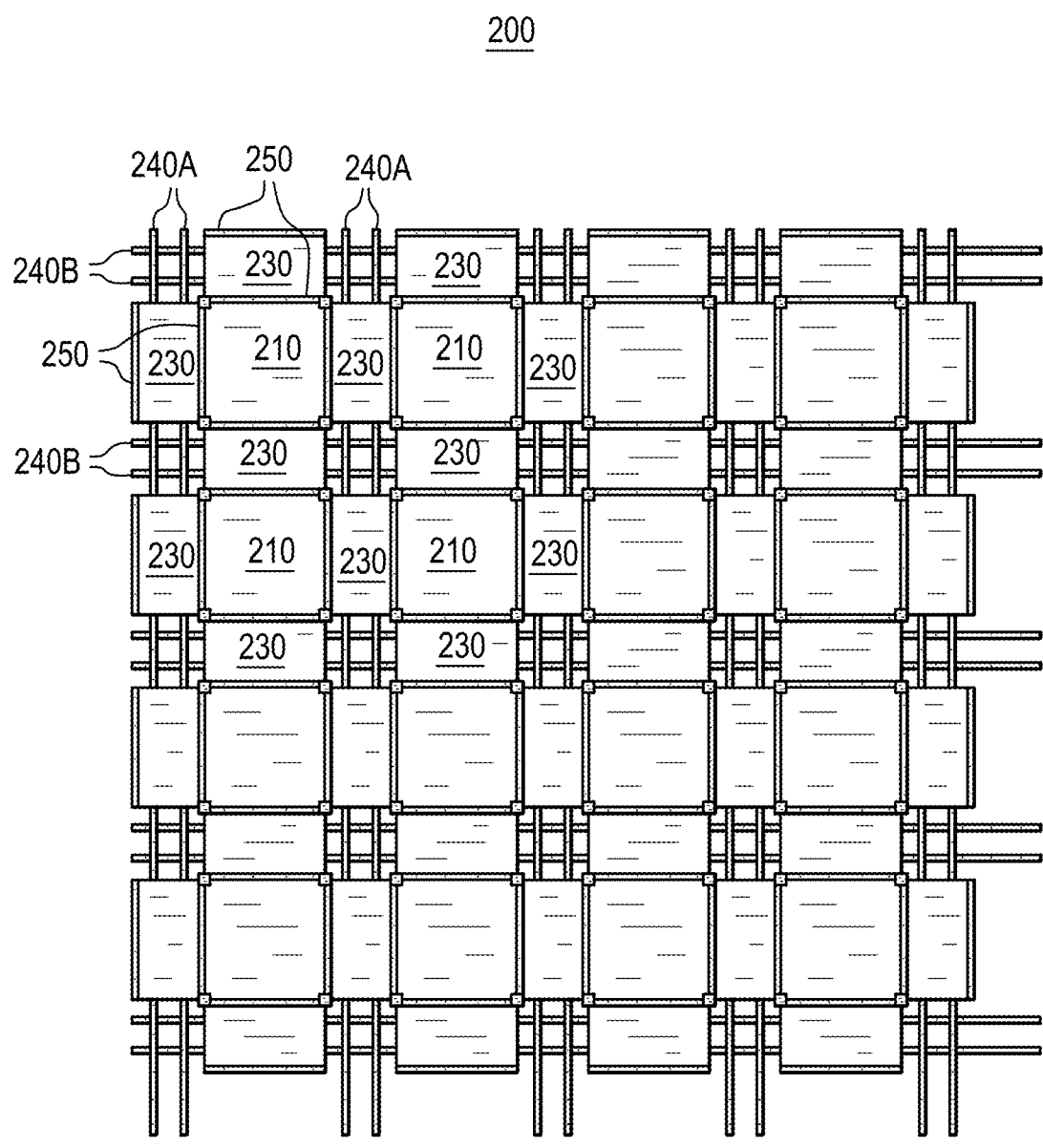
FIG. 3B illustrates a plan view of the EA-controlled smart surface of FIG. 2A with respect to a view position below the EA-controlled smart surface according to at least some example embodiments.

FIG. 2A illustrates a perspective view of an EA-controlled smart surface 200. FIG. 2B illustrates a perspective view of the EA-controlled smart surface 200 which is zoomed-in relative to the view in FIG. 2B. For the purpose of clarity, the EA-controlled smart surface 200 is illustrated in FIGS. 2A and 2B without first and second upper dielectric layers 260A and 260B. FIG. 2C illustrates first and second upper dielectric layers 260A and 260B of the EA-controlled smart surface 200 with reference to a perspective view of the EA-controlled smart surface 200. FIG. 2D illustrates the first and second upper dielectric layers 260A and 260B of the EA-controlled smart surface 200 with reference to a perspective view of the EA-controlled smart surface 200 that is zoomed-in relative to the view of FIG. 2C. FIG. 3A illustrates a plan view of the EA-controlled smart surface of FIGS. 2A-2B with respect to a view position above the EA-controlled smart surface. FIG. 3B illustrates a plan view of the EA-controlled smart surface of FIGS. 2A-2B with respect to a view position below the EA-controlled smart surface.

As is illustrated in FIGS. 2A-3B, the EA-controlled smart surface 200 may include a plurality of dielectric tiles 210 arranged, for example, as a dielectric tile array. The dielectric tile array may be, for example, a rectangular array on the X-Y plane. Dielectric tiles 210 may be composed of any dielectric material. Example materials of the dielectric tiles 210 include, but are not limited to polytetrafluroethylene (PTFE) and the flame resistant material, FR4. As is also illustrated in FIGS. 2A-3B, with respect to the X-Y plane, a bias plate 250 is affixed to each side of each dielectric tile. The bias plate 250 may also be referred to in the present disclosure as a bias pad 250. For example, in the example shown in FIGS. 2A-3B, each dielectric tile 210 has a four-sided, square-shaped footprint. Thus, in the example shown in FIGS. 2A-3B, each dielectric tile 210 is affixed to four bias plates 250. Further, as is also illustrated in FIGS. 2A-3B, each bias plate 250 is mechanically affixed, and electrically connected, to an EA material block 230. Thus, according to at least some example embodiments, between each adjacent pair of dielectric tiles 210 (both in the X-direction and the Y-direction) is an EA material block 230 sandwiched between a pair of bias plates 250. Example materials of the EA material block 230 include, but are not limited to, silicone (e.g.

Polydimethylsiloxane), or acrylic elastomers, siliconic rubber, polyurethane elastomers, each, for example, with electrically conducting foil or coatings (e.g., graphite, carbon nanotubes, metal films, gels with metallic particles, stimuli-responsive gels encapsulated by an elastomer or caoutchouc) on the sides; and stimuli-responsive gels. The EA material block 230 may also be referred to in the present disclosure as EA block 230.

The EA material blocks 230 are each blocks of material that change shape (e.g., by expanding or contracting) as a result of being actuated based on the application of a voltage via the bias plates 250 affixed to opposite sides of each EA material block. Voltages may be applied to the bias plates 250 via Y-direction sliding contacts 220A and X-direction sliding contacts 220B, which are mechanically affixed, and electrically connected, to the bias plates 250, as shown in FIGS. 2A-3B. As is explained in greater detail below, EA material blocks 230 sandwiched between bias pads 250 that are connected to X-direction sliding contacts 220B expand (or contract) in a direction parallel to the X-axis when actuated. Further, EA material blocks 230 sandwiched between bias pads 250 that are connected to Y-direction sliding contacts 220A expand (or contract) in a direction parallel to the Y-axis when actuated.

For example, as is also illustrated in FIGS. 2A-3B, the EA-controlled smart surface 200 includes a plurality of Y-direction bias line pairs 240A and X-direction bias line pairs 240B for facilitating the application of actuating voltages to the EA material blocks 230. Bias pads 250, Y-direction sliding contacts 220A, X-direction sliding contacts 220B, Y-direction bias line pairs 240A, and X-direction bias line pairs 240B may each be composed of a conductive material. Examples of such a conductive material include, but are not limited to, copper. As is illustrated in FIGS. 2C and 2D, the X-direction bias line pairs 240B may be embedded in the first upper dielectric layer 260A and the Y-direction bias line pairs 240A may be embedded in the first upper dielectric layer 260A.

Further, though not illustrated, according to at least some example embodiments, the first upper dielectric layer 260A includes z-direction grooves (e.g., indentations) or, alternatively, openings in the vicinity of each of the Y-direction sliding contacts 220A, so as to allow for free movement of the Y-direction sliding contacts 220A when the EA blocks 230 expand and contract. Additionally, though not illustrated, according to at least some example embodiments, the second upper dielectric layer 260B includes z-direction openings in the vicinity of each of the Y-direction sliding contacts 220A and includes z-direction grooves (e.g., indentations) or, alternatively, openings in the vicinity of each of the X-direction sliding contacts 220B, so as to allow for free movement of the Y-direction sliding contacts 220A and the X-direction sliding contacts 220B when the EA blocks 230 expand and contract.

As is also illustrated in FIGS. 2A-3B, each Y-direction sliding contact 220A may contact a bias line from among an X-direction bias line pair 240B. Thus, activating an X-direction bias line pair 240B by selectively applying voltages to bias lines of the X-direction bias line pair 240B results in the application of an actuating voltage to an EA material block 230 which actuates the EA material block. The actuating voltage is applied via the bias plates 250 affixed to opposing sides of the EA material block 230, and the Y-direction sliding contacts 220A which are affixed to the bias plates 250 and contact the activated X-direction bias line pair 240B. Once actuated, the EA material block 230 expands (or contracts) in a direction parallel to the Y-axis. As a result, the Y-direction sliding contacts 220A affixed to the bias plates 250 which are affixed to the opposite sides of the expanding (or contracting) EA material block 230 slide, in a direction parallel to the Y-axis, against the activated X-direction bias line pair 240B as the EA material block 230 expands (or contracts).

Similarly, each X-direction sliding contact 220B may contact a bias line from among a Y-direction bias line pair 240A. Thus, activating a Y-direction bias line pair 240A by selectively applying voltages to bias lines of the Y-direction bias line pair 240A results in the application of an actuating voltage to an EA material block 230 which actuates the EA material block 230. The actuating voltage is applied via the bias plates 250 affixed to opposing sides of the EA material block 230, and the X-direction sliding contacts 220B which are affixed to the bias plates 250 and contact the activated Y-direction bias line pair 240A. As a result, the X-direction sliding contacts 220B affixed to the bias plates 250 which are affixed to the opposite sides of the expanding (or contracting) EA material block 230 slide, in a direction parallel to the X-axis, against the activated Y-direction bias line pair 240A as the EA material block 230 expands (or contracts).

Thus, by activating the EA material blocks 230 of the EA-controlled smart surface 200 according to at least some example embodiments, the dielectric tiles 210 become mobile in the x and y directions, thus resulting in a smart surface whose dielectric permittivity is (i) a function of the spatial position and, (ii) due to the nature of EA materials, controllable. Because the EA-controlled smart surface 200 has dielectric permittivity which, as a function of the spatial coordinates, is controllable, the EA-controlled smart surface 200 may be used to perform a variety of mathematical operations, including differentiation, integration, convolution and more, as indicated earlier. Furthermore, by properly manipulating the dielectric permittivity as a function of the spatial coordinates, the EA-controlled smart surface 200 may be used to directly modulate an input signal impinging a surface of the EA-controlled smart surface 200. According to at least some example embodiments, the above-referenced direct modulation can be accomplished by applying a message signal (e.g., a modulating signal including information) to the bias lines of the proposed surface.

Figure 4:
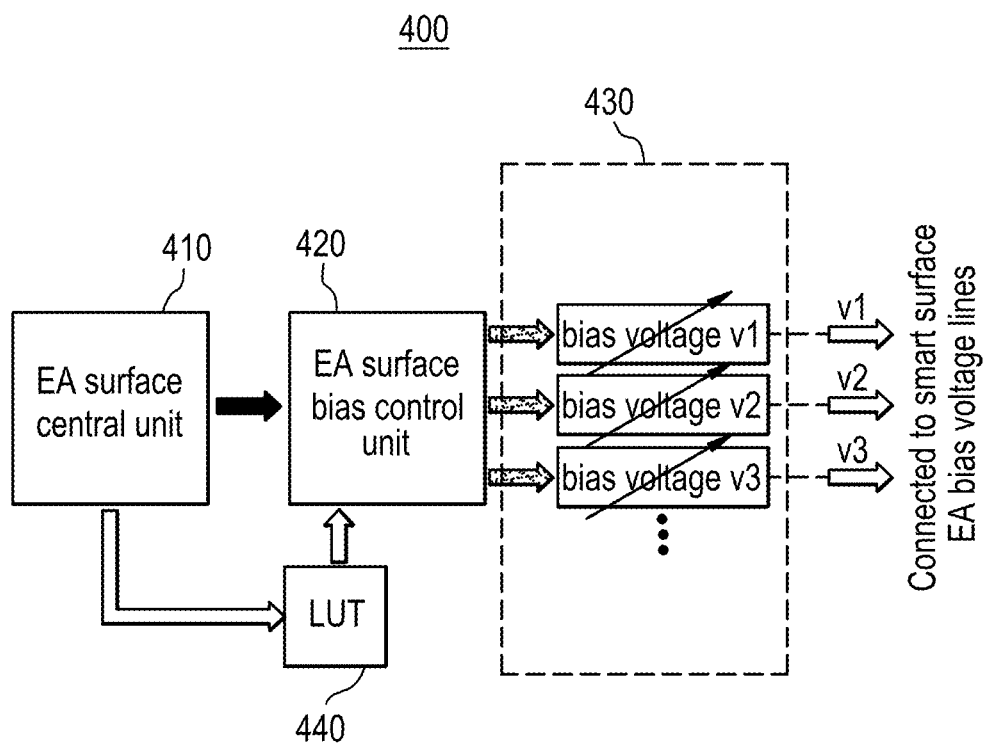
FIG. 4 is a diagram illustrating EA-controlled smart surface control circuitry according to at least some example embodiments.

FIG. 4 is a diagram illustrating EA-controlled smart surface control circuitry 400 according to at least some example embodiments. According to at least some example embodiments, the control circuitry 400 controls the operation of an EA-controlled smart surface, or an EA-controlled multi-surface structure, by providing control voltages to one or more Y-direction bias line pairs and/or one or more X-direction bias line pairs of one or more EA-controlled smart surfaces. According to at least some example embodiments, an EA-controlled multi-surface structure is a structure that includes multiple EA-controlled smart surfaces stacked on each other. A layer of an EA-controlled multi-surface structure is an EA-controlled smart surface. Accordingly, an EA-controlled smart surface may also be referred to in the present disclosure as an EA-controlled smart surface layer.

Referring to FIG. 4, the control circuitry 400 may include an EA-controlled smart surface central unit 410, an EA-controlled smart surface bias control unit 420, a plurality of bias power supply circuits 430, and a look up table (LUT) 440, each of which may be embodied by circuits or circuitry. The EA-controlled smart surface central unit 410 and EA-controlled smart surface bias control unit 420 may also be referred to in the present specification as the central unit 410 and bias control unit 420, respectively. The central unit 410 and bias control unit 420 may be separate elements (e.g., separate circuits), as illustrated in FIG. 4. Alternatively, the operations of the bias control unit 420 may be performed by the central unit 410.

According to at least one example embodiment of the inventive concepts, the central unit 410 may include or be implemented by one or more circuits or circuitry (e.g., hardware) specifically structured to carry out and/or control some or all of the operations described in the present disclosure as being performed by the central unit 410, the control circuitry 400, or an element thereof. According to at least one example embodiment of the inventive concepts, the central unit 410 may include or be implemented by a memory and one or more processors executing computer-readable code (e.g., software and/or firmware) that is stored in the memory and includes instructions for causing the one or more processors to carry out and/or control some or all of the operations described in the present specification as being performed by the central unit 410, the control circuitry 400, or an element thereof. According to at least one example embodiment of the inventive concepts, the central unit 410 may be implemented by, for example, a combination of the above-referenced hardware and one or more processors executing computer-readable code.

According to at least some example embodiments, the central unit 410 controls the operations of the control circuitry 400, generally. According to at least some example embodiments, the central unit 410 controls the bias control unit 420, the bias control unit 420 controls the power supply units 430, and the power supply units 430 are circuits that each generate an adjustable bias voltage. For example, the power supply units may be electrically connected to bias voltage lines (e.g., Y-direction bias line pairs and/or X-direction bias line pairs), and may provide bias voltages to EA blocks 230 of an EA-controlled smart surface via the bias voltage lines. Each EA block 230 may be actuated in response to the control circuitry 400 supplying a bias voltage to the EA block 230. For example, each EA block 230 may be actuated in response to one or more power supply units 430 supplying a bias voltage to the bias voltage line pair that is electrically connected to the EA block 230.

According to at least some example embodiments, the central unit 410 controls the bias control unit 420 to cause the power supply units 430 to output bias voltages to bias voltage lines of an EA-controlled smart surface, or an EA-controlled multi-surface structure, in accordance with a desired signal processing function (e.g., a desired mathematical function to be performed on an input signal by the EA-controlled smart surface or EA-controlled multi-surface structure). For example, the LUT 440 may store bias voltage values for different known EA-controlled smart surface configurations (e.g., different arrangements of actuated and non-actuated EA blocks of an EA-controlled smart surface, or an EA-controlled multi-surface structure). The known EA-controlled smart surface configurations may correspond to desired signal processing functions. According to at least some example embodiments, the desired signal processing operations may be signal processing operations for either single EM wave processing or also parallel processing of several EM waves. Accordingly, the LUT 440 may provide quick access to bias voltage values associated with desired EA-controlled smart surface configurations. According to at least some example embodiments, the LUT 440 may store pre-defined values set by a designer or manufacturer of the control circuitry 400, and/or the LUT 440 may store values that are written to the LUT 440 during use of the control circuitry 400, for example, in accordance with preferred EA-controlled smart surface configurations of an operator of the control circuitry 400. According to at least some example embodiments, the LUT 440 may be included in the central unit 410, included in the bias control unit 420, or separate from both the central unit 410 and the bias control unit 420. According to at least some example embodiments, the control circuitry 400 omits the LUT 440. For example, bias voltage values may be provided directly from the central unit 410 to the bias control unit 420.

According to a least some example embodiments, the power supply units 430 can supply a voltage for actuating EA blocks to one or more Y-direction bias line pairs 420A of an EA-controlled smart surface in order to cause one or more columns of dielectric tiles 210 of the EA-controlled smart surface to move in the x-direction relative to neighboring columns of dielectric tiles 210. According to a least some example embodiments, the power supply units 430 can supply a voltage for actuating EA blocks to all Y-direction bias line pairs 420A of an EA-controlled smart surface in order to cause all columns of dielectric tiles 210 of an EA-controlled smart surface to move in the X-direction relative to neighboring columns of dielectric tiles 210.

According to a least some example embodiments, the power supply units 430 can supply a voltage for actuating EA blocks to one or more X-direction bias line pairs 420B of an EA-controlled smart surface in order to cause one or more rows of dielectric tiles 210 of the EA-controlled smart surface to move in the Y-direction relative to neighboring rows of dielectric tiles 210. According to a least some example embodiments, the power supply units 430 can supply a voltage for actuating EA blocks to all X-direction bias line pairs 420B of an EA-controlled smart surface in order to cause all rows of dielectric tiles 210 of the EA-controlled smart surface to move in the Y-direction relative to neighboring rows of dielectric tiles 210.

Figure 5A:
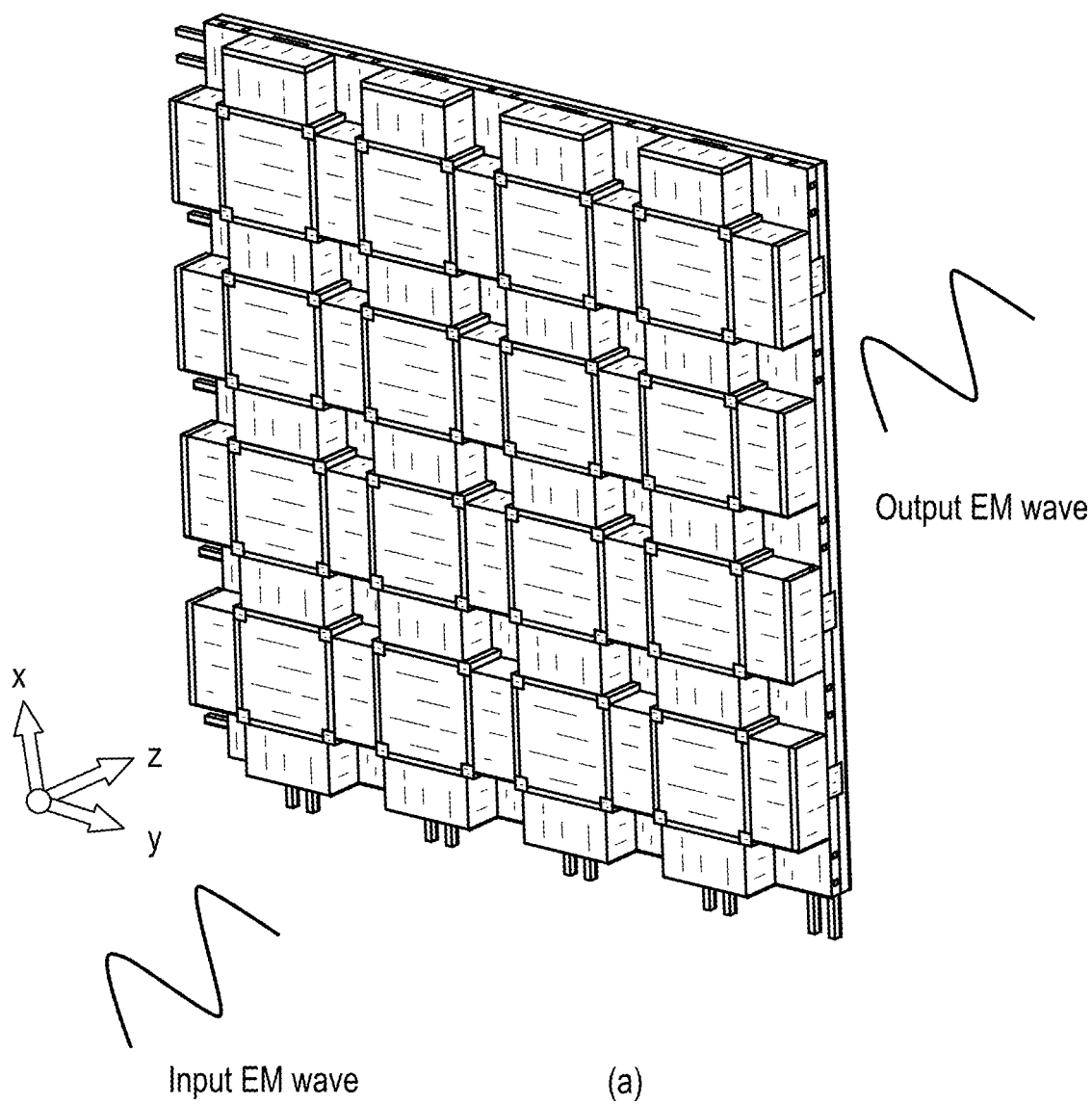
FIGS. 5A and 5B illustrate various views of an input electromagnetic (EM) wave impinging on an EA-controlled smart surface, and a resulting output EM wave, according to at least some example embodiments.
Figure 5B:
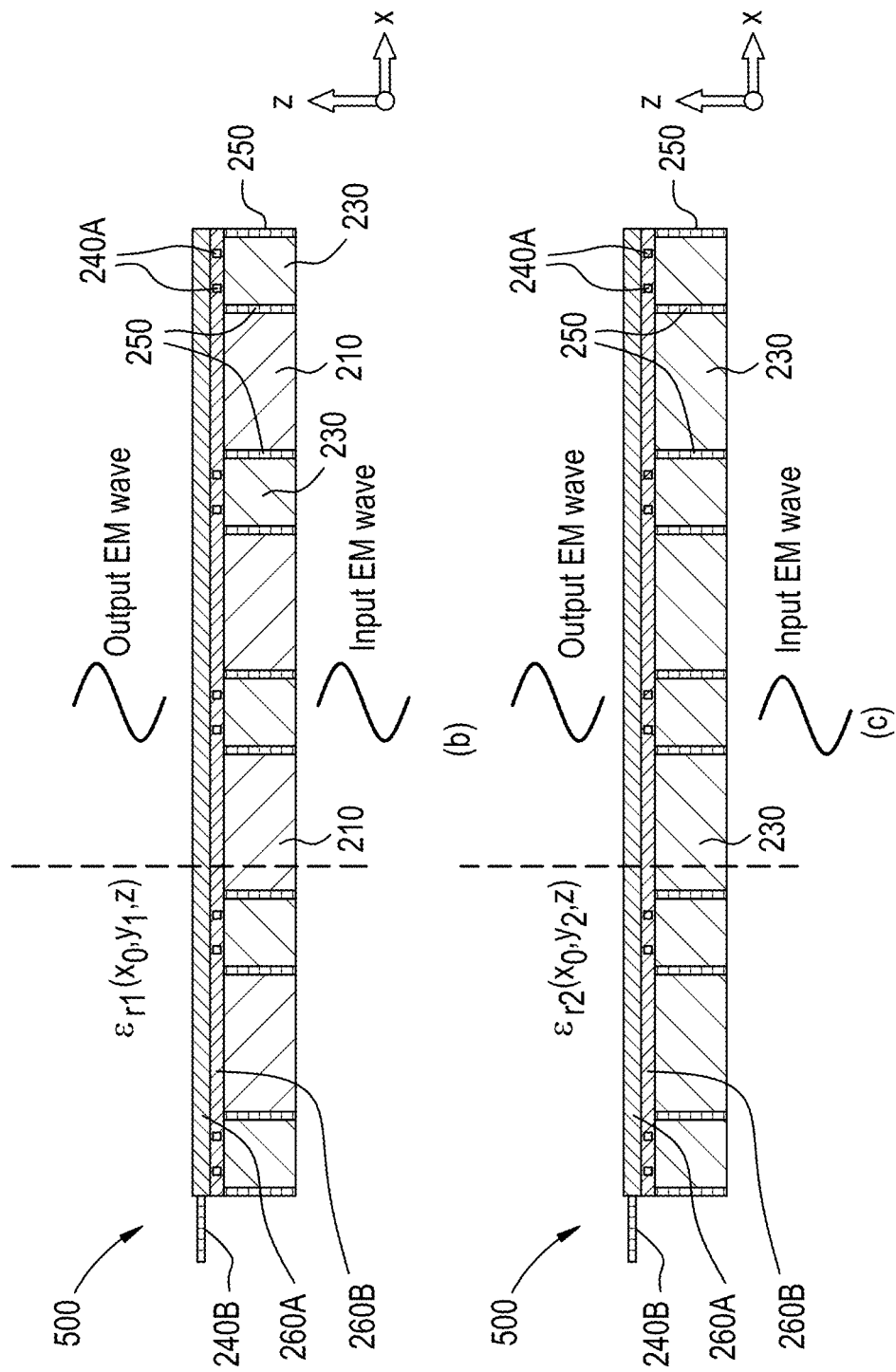

FIGS. 5A and 5B illustrate various views of an input EM wave impinging on an EA-controlled smart surface 500, and a resulting output EM wave, according to at least some example embodiments. The EA-controlled smart surface 500 may have the same structure as the EA-controlled smart surface 200 illustrated in FIGS. 2A-3B, and may be controlled by the control circuitry 400 illustrated in FIG. 4. FIG. 5A illustrates a perspective view of the EA-controlled smart surface 500, as well as input and output EM waves traveling in a direction parallel to the Z-direction. Item (b) in FIG. 5B illustrates a cross sectional view of the EA-controlled smart surface 500 at point $(x_0, y_1, z)$. Item (c) in FIG. 5B illustrates a cross sectional view of the EA-controlled smart surface 500 at point $(x_0, y_2, z)$. Points $(x_0, y_1, z)$ and $(x_0, y_2, z)$ are each illustrated as vertical, hashed lines in FIG. items (b) and (c) of FIG. 5B. The dielectric permittivity at point $(x_0, y_1, z)$ (i.e., $\varepsilon_{r1}$) may be different than the dielectric permittivity at point $(x_0, y_2, z)$ (i.e., $\varepsilon_{r2}$) because the materials through which an EM wave would pass at these two different points differ. As is illustrated in FIG. 5B, at point $(x_0, y_1, z)$, the dielectric permittivity (i.e., $\varepsilon_{r1}$) would be determined based on characteristics of the first and second upper dielectric layers 260A and 260B, and characteristics of a dielectric tile 210. In contrast, at point $(x_0, y_1, z)$, the dielectric permittivity (i.e., $\varepsilon_{r2}$) would be determined based on characteristics of the first and second upper dielectric layers 260A and 260B, and characteristics of an EA block 230.

By actuating the EA blocks 230 through the application of the bias voltages to the bias lines 240A and 240B by power supply units 430, the dielectric tiles 210 can be moved in the x and y directions, allowing for different spatial distributions of the dielectric permittivities. It follows from Expression (3) that the ability to control the spatial distribution of the dielectric permittivity caters for G(x,y), which dictates the type of functionality obtainable from the smart surface. By stacking multiple EA-controlled smart surfaces 500 of FIGS. 5A and 5B, the structure of FIGS. 6A and 6B is obtained.

Figure 6A:
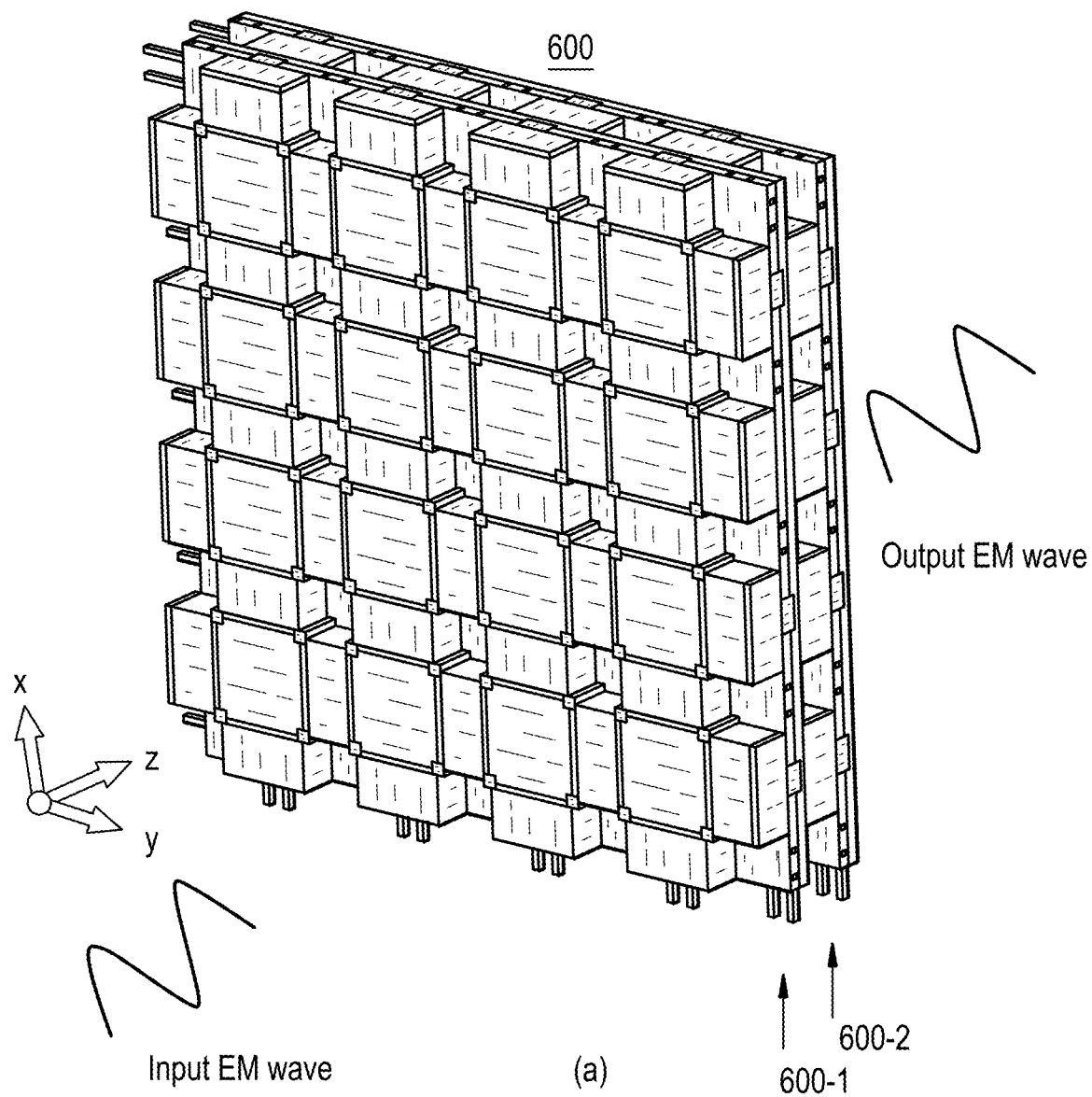
FIGS. 6A and 6B illustrate various views of an input EM wave impinging on a 2-layer EA-controlled multi-surface structure including 2 stacked EA-controlled smart surfaces, and a resulting output EM wave, according to at least some example embodiments.
Figure 6B:
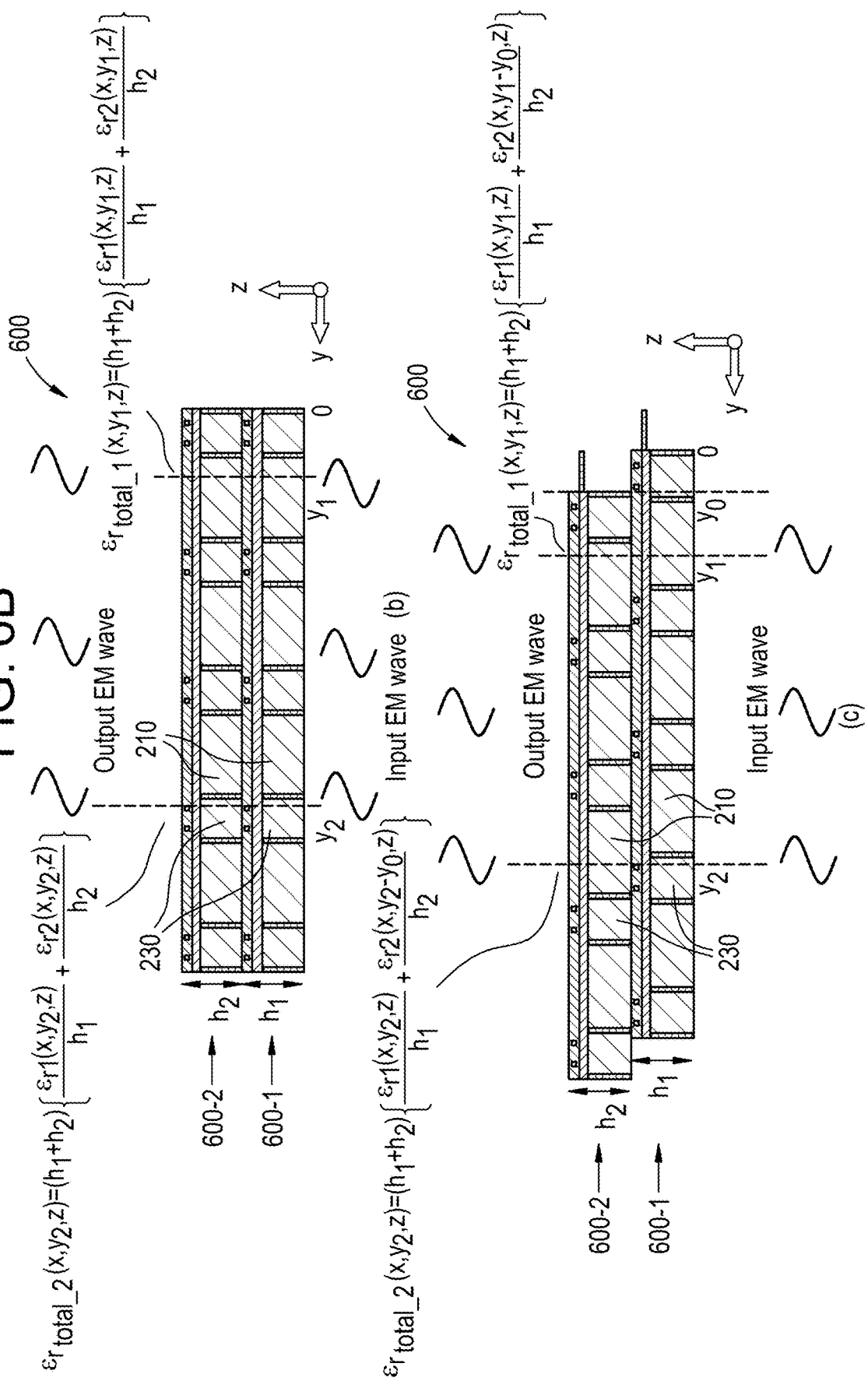

FIGS. 6A and 6B illustrate various views of an input EM wave impinging on a 2-layer EA-controlled multi-surface structure 600 including 2 stacked EA-controlled smart surfaces 600-1 and 600-2, and a resulting output EM wave, according to at least some example embodiments. FIG. 6A illustrates a perspective view of the EA-controlled multi-surface structure 600, which includes a first EA-controlled smart surface 600-1 and a second EA-controlled smart surface 600-2 stacked on top of the first EA-controlled smart surface 600-1 in the Z-direction. The first and second EA-controlled smart surfaces 600-1 and 600-2 may each have the same structure as the EA-controlled smart surface 200 illustrated in FIGS. 2A-3B and/or the EA-controlled smart surface 500 illustrated in FIGS. 5A and 5B. Further, the first and second EA-controlled smart surfaces 600-1 and 600-2 may be controlled by the control circuitry 400 illustrated in FIG. 4.

Items (b) and (c) in FIG. 6B illustrate cross-sectional views of the first and second EA-controlled smart surfaces 600-1 and 600-2 of the EA-controlled multi-surface structure 600. Item (b) in FIG. 6B illustrates an arrangement in which dielectric tiles 210 and EA blocks 230 of the first and second EA-controlled smart surfaces 600-1 and 600-2 are vertically aligned. Further, in item (b) of FIG. 6B, spatial positions (x,y$_2$,z) and (x,y$_1$,z) of the first and second EA-controlled smart surfaces 600-1 and 600-2 are illustrated by dashed lines corresponding to y coordinate y$_1$ and y coordinate y$_2$. Item (c) in FIG. 6B illustrates an arrangement in which dielectric tiles 210 and EA blocks 230 of the first and second EA-controlled smart surfaces 600-1 and 600-2 are shifted with respect to one another, and thus, are not vertically aligned. In the example illustrated in item (c) of FIG. 6B, the second EA-controlled smart surface 600-2 has shifted leftwards a distance that corresponds to y coordinate y$_0$ relative to the first EA-controlled smart surface 600-1, which has not been shifted in the example illustrated in item (c) of FIG. 6B. Thus, spatial positions (x,y$_1$,z) and (x,y$_2$,z) of the first EA-controlled smart surface 600-1 are aligned with spatial positions (x,y$_1$−y$_0$,z) and (x,y$_2$−y$_0$,z) of the second EA-controlled smart surface 600-2, respectively.

As illustrated in FIG. 6B, manipulation of the effective dielectric permittivity is obtainable. The extent of the dielectric tunability is dependent on the values of the dielectric permittivity of the dielectric tile, the EA material and that of the upper dielectric layers 260A and 260B, which separate the individual layers and, also, support of the bias lines 240A and 240B. It should be noted that for the case of a two-layer EA-controlled multi-surface structure depicted in FIGS. 6A and 6B, at any point on the surface there are 4 obtainable dielectric states, which are discussed below with reference to Expressions (7)-(10), respectively. For the purpose of simplicity, Expressions (7)-(10) will be explained without regard to the dielectric permittivities of the first and second upper dielectric layers 260A and 260B of each of the first and second EA-controlled smart surfaces 600-1 and 600-2 of the EA-controlled multi-surface structure 600.

Referring to item (b) of FIG. 6B, a total dielectric permittivity associated with EA blocks 230 of the first and second EA-controlled smart surfaces 600-1 and 600-2, respectively, being vertically aligned is represented by Expression (7), below, and a total dielectric permittivity associated with dielectric tiles 210 of the first and second EA-controlled smart surfaces 600-1 and 600-2, respectively, being vertically aligned is represented by Expression (8), below:

$$\varepsilon_{r\_total} = (h_1 + h_2)\left(\frac{\varepsilon_{r\_EA\_material}}{h_1} + \frac{\varepsilon_{r\_EA\_material}}{h_2}\right), \quad (7)$$

$$\varepsilon_{r\_total} = (h_1 + h_2)\left(\frac{\varepsilon_{r\_diel\_tile}}{h_1} + \frac{\varepsilon_{r\_diel\_tile}}{h_2}\right). \quad (8)$$

Referring to item (c) of FIG. 6B, a total dielectric permittivity associated with a dielectric tile 210 of the first EA-controlled smart surface 600-1 being aligned with an EA block 230 of the second EA-controlled smart surface 600-2 is represented by Expression (9), below, and a total dielectric permittivity associated with an EA block 230 of the first EA-controlled smart surface 600-1 being aligned with a dielectric tile 210 the second EA-controlled smart surface 600-2 is represented by Expression (10), below:

$$\varepsilon_{r\_total} = (h_1 + h_2)\left(\frac{\varepsilon_{r\_diel\_tile}}{h_1} + \frac{\varepsilon_{r\_EA\_material}}{h_2}\right), \quad (9)$$

$$\varepsilon_{r\_total} = (h_1 + h_2)\left(\frac{\varepsilon_{r\_EA\_material}}{h_1} + \frac{\varepsilon_{r\_diel\_tile}}{h_2}\right). \quad (10)$$

Referring to Expressions (7)-(10) and FIGS. 6A-6B, total dielectric permittivities (i.e., $\varepsilon_{r\_total}$) associated with various vertical configurations of EA blocks 230 and dielectric tiles 210 of stacked EA-controlled smart surfaces in an EA-controlled multi-surface structure depend on the vertical (i.e., z-direction) heights (i.e., h$_1$ and h$_2$) of the stacked EA-controlled smart surfaces, a dielectric permittivity of each EA block 230 (i.e., $\varepsilon_{r\_EA\_material}$), and a dielectric permittivity of each dielectric tile 210 (i.e., $\varepsilon_{r\_diel\_tile}$). Expressions (7)-(10) define a total dielectric constant for 4 states of the 2-layer EA-controlled multi-surface structure illustrated in FIG. 6B, respectively: EA block 230 over EA block 230; dielectric tile 210 over dielectric tile 210; EA block 230 over dielectric tile 210; and dielectric tile 210 over EA block 230, where the second EA-controlled smart surface 600-2 is considered to be over the first EA-controlled smart surface 600-1, as illustrated in FIG. 6(B). Further, for the case when the individual smart surfaces have identical composition and heights, the number of states in this case reduces to 3 (for example, Expressions (9) and (10) become degenerate). As is illustrated by expressions (7)-(10), determining a total dielectric constant corresponding to a particular spatial position with respect to stacked EA-controlled smart surfaces may include weighting the dielectric constant of each individual EA-controlled smart surface at that spatial position, by height (e.g., h$_1$ and h$_2$). Accordingly, determining a total dielectric constant corresponding to a particular spatial position with respect to stacked EA-controlled smart surfaces may include weighting in the vertical direction (i.e., by height). However, according to at least some example embodiments, determination of a dielectric constant of a single EA-controlled smart surface or a total dielectric constant of an EA-controlled multi-surface structure may also include weighting in a horizontal direction, as is illustrated by FIG. 6C.

FIG. 6C is a diagram for explaining weighting of a dielectric constant of an EA-controlled smart surface or an EA-controlled multi-surface structure in a horizontal direction. In FIG. 6C, blocks including EA material like that of the EA blocks 230 of FIGS. 2A-6B are shown as first blocks EA and blocks including dielectric material like that of the dielectric tiles 210 of FIGS. 2A-6B are shown as second blocks Er. Items (d) through (f) of FIG. 6C illustrate portions of first and second EA-controlled smart surface layers 650-1 and 650-2, which are stacked in an EA-controlled multi-surface structure. Items (d) through (f) of FIG. 6C illustrate respectively different vertical alignments of the first and second EA-controlled smart surface layers 650-1 and 650-2.

Item (d) of FIG. 6C illustrates an example of spatial position where an EM wave 660 impinging the first and second EA-controlled smart surface layers 650-1 and 650-2 would be affected by the dielectric constants of second blocks Er of both the first and second EA-controlled smart surface layers 650-1 and 650-2. Item (e) of FIG. 6C illustrates an example of spatial position where an EM wave 660 impinging the first and second EA-controlled smart surface layers 650-1 and 650-2 would be affected by the dielectric constants of a first block of the first EA-controlled smart surface layer 650-1 and a second block Er of the second EA-controlled smart surface layer 650-2.

However, in contrast to items (d) and (e) of FIG. 6(C), at the spatial position illustrated in item (f) of FIG. 6(C), the EM wave 660 would be affected by a mixture of portions of both a first block EA and a second block Er of the second EA-controlled smart surface layer 650-2, after passing through the second block Er of the first EA-controlled smart surface layer 650-1. Thus, in addition to stacked EA-controlled smart surface layers of a EA-controlled multi-surface structure having a weighted dielectric value in the vertical direction (i.e., corresponding to the relative heights of the individual stacked layers), a weighted dielectric value may also exist in the horizontal direction depending on how much of each Er and EA region is affecting the wave. For example, a dielectric value of an EA smart surface may be weighted in the horizontal direction based on relative sizes of Er and EA regions (e.g., dielectric tiles 210 and EA blocks 230) in the EA smart surface. Further, a total dielectric value of an EA-controlled multi-surface structure may be weighted in the horizontal direction based on relative sizes of Er and EA regions (e.g., dielectric tiles 210 and EA blocks 230) in each of the stacked EA smart surface layers of the EA-controlled multi-surface structure.

Further, according to at least some example embodiments, suitable measures are employed to guide an EM wave through an EA-controlled smart surface or EA-controlled multi-surface layer along selected paths, such as those indicated as indicated by, for example, FIG. 6C. As an example, of such suitable measures, slit diagrams may be used to guide an EM wave along desired paths through an EA-controlled smart surface, or along desired paths through multiple EA-controlled smart surface layers of an EA-controlled multi-surface structure.

A general solution consisting on n layers will now be described below with reference to FIGS. 7A-7B (n being a positive integer greater than 1).

Figure 7A:
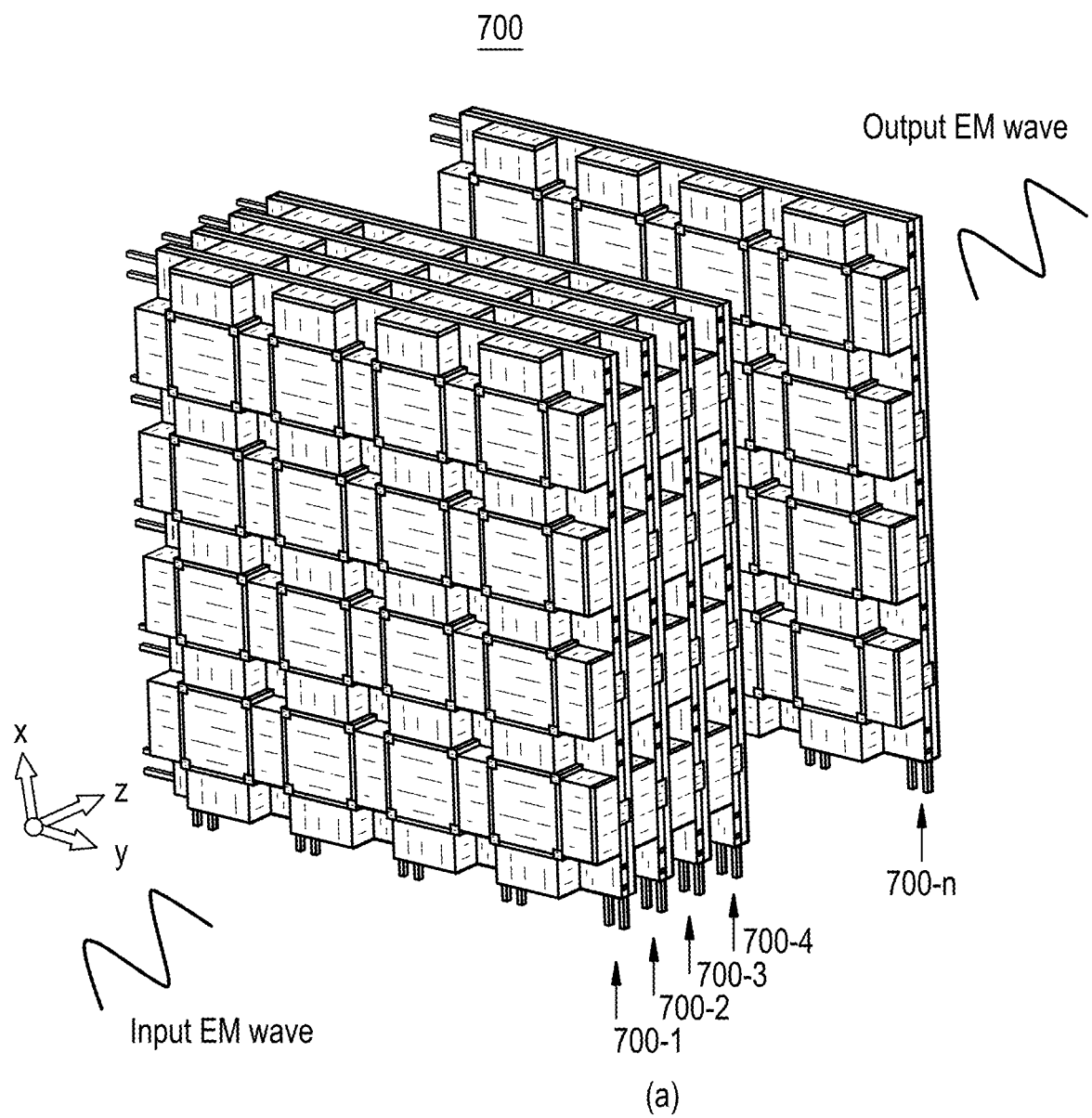
FIGS. 7A and 7B illustrate various views of an input EM wave impinging on an n-layer EA-controlled multi-surface structure including n stacked EA-controlled smart surfaces, and a resulting output EM wave, according to at least some example embodiments.
Figure 7B:
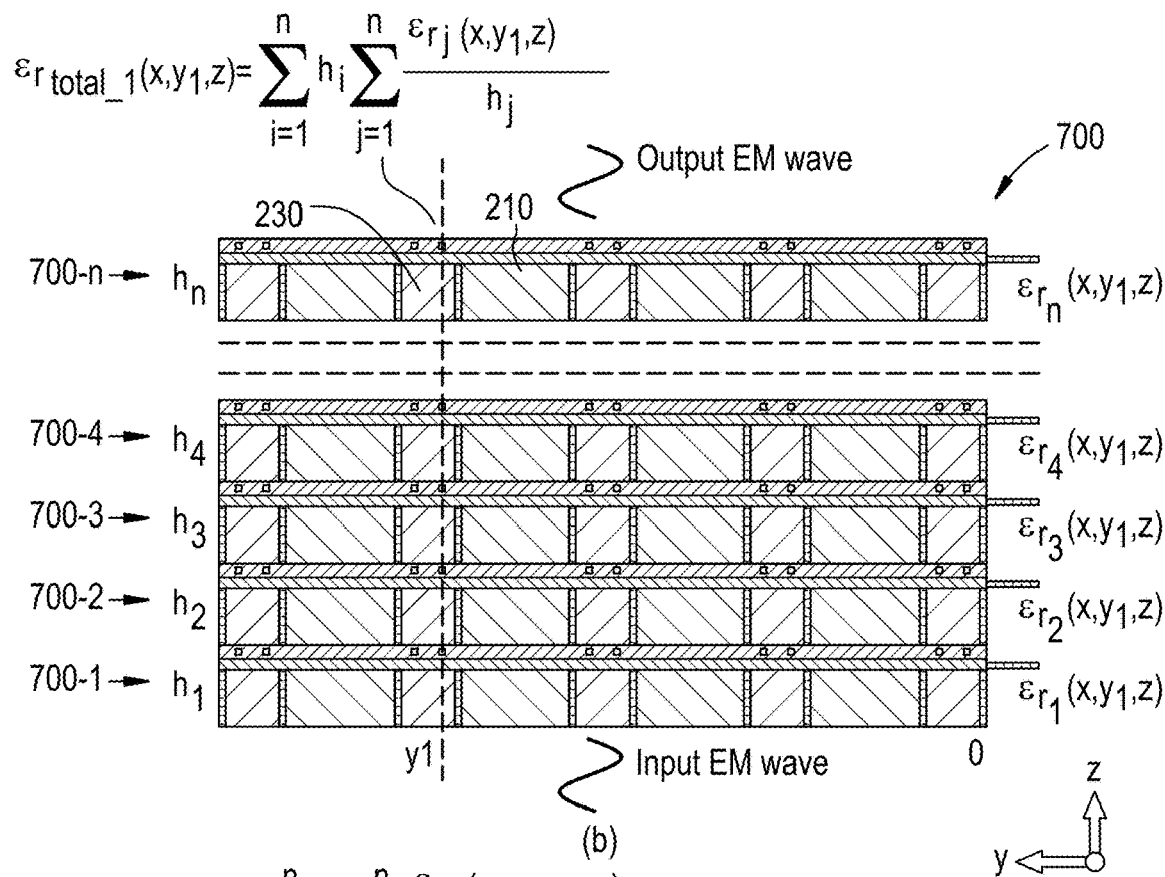
Figure 7B:
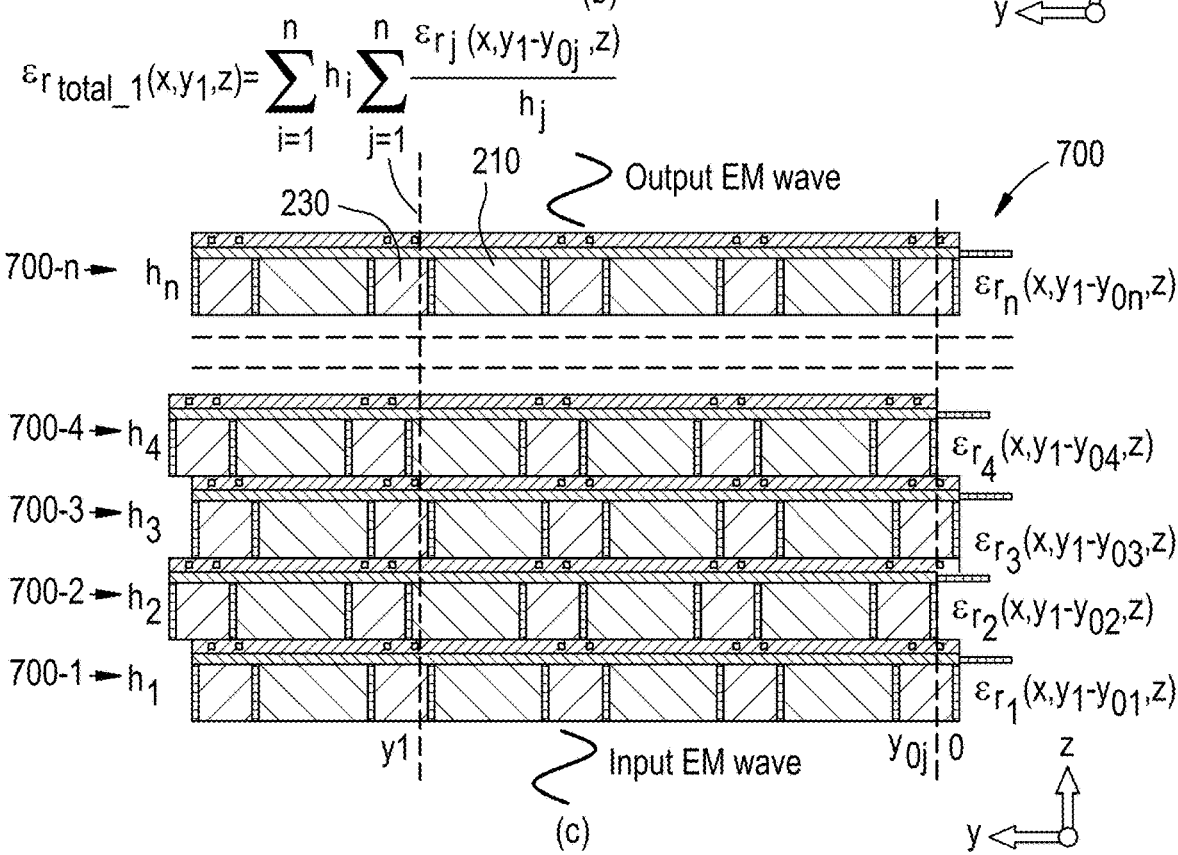

FIGS. 7A and 7B illustrate various views of an input EM wave impinging on an n-layer EA-controlled multi-surface structure 700 including n stacked EA-controlled smart surfaces 700-1~700-n, and a resulting output EM wave, according to at least some example embodiments. FIG. 7A illustrates a perspective view of the EA-controlled multi-surface structure 700, which includes a first through $n^{th}$ EA-controlled smart surfaces, 700-1~700-n. The first through $n^{th}$ EA-controlled smart surfaces 700-1~700-n may each have the same structure as the EA-controlled smart surface 200 illustrated in FIGS. 2A-3B and/or the EA-controlled smart surface 500 illustrated in FIGS. 5A and 5B. Further, the first through $n^{th}$ EA-controlled smart surfaces 700-1~700-n may be controlled by the control circuitry 400 illustrated in FIG. 4.

Items (b) and (c) in FIG. 7B illustrate cross-sectional views of the first through $n^{th}$ EA-controlled smart surfaces 700-1 and 700-n of the EA-controlled multi-surface structure 700 at a point $(x_0, y_0, z)$. Item (b) in FIG. 7B illustrates an arrangement in which dielectric tiles 210 and EA blocks 230 of adjacent pairs of EA-controlled smart surfaces from among the first through $n^{th}$ EA-controlled smart surfaces 700-1 and 700-n are vertically aligned. Further, in item (b) of FIG. 7B, spatial position $(x, y_1, z)$ of the first through $n^{th}$ EA-controlled smart surfaces 700-1 through 700-n is illustrated by a dashed line corresponding to y coordinate $y_1$. Item (c) in FIG. 7B illustrates an arrangement in which dielectric tiles 210 and EA blocks of adjacent pairs of EA-controlled smart surfaces from among the first through $n^{th}$ EA-controlled smart surfaces 700-1 and 700-n are shifted with respect to one another, and thus, are not vertically aligned. In the example illustrated in item (c) of FIG. 7B, the even EA-controlled smart surfaces (e.g., 700-2 and 700-4) have shifted leftwards a distance that corresponds to y coordinate $y_{0j}$ relative to the first EA-controlled smart surface 700-1, where j is a positive integer indicating a $j_{th}$ EA-controlled smart surface (i.e., 700-j), and $y_{0j}$ indicates a distance that the $j^{th}$ EA-controlled smart surface has shifted leftward relative to the first EA-controlled smart surface 700-1, which has not been shifted in the example illustrated in item (c) of FIG. 7B.

Figure 7C:
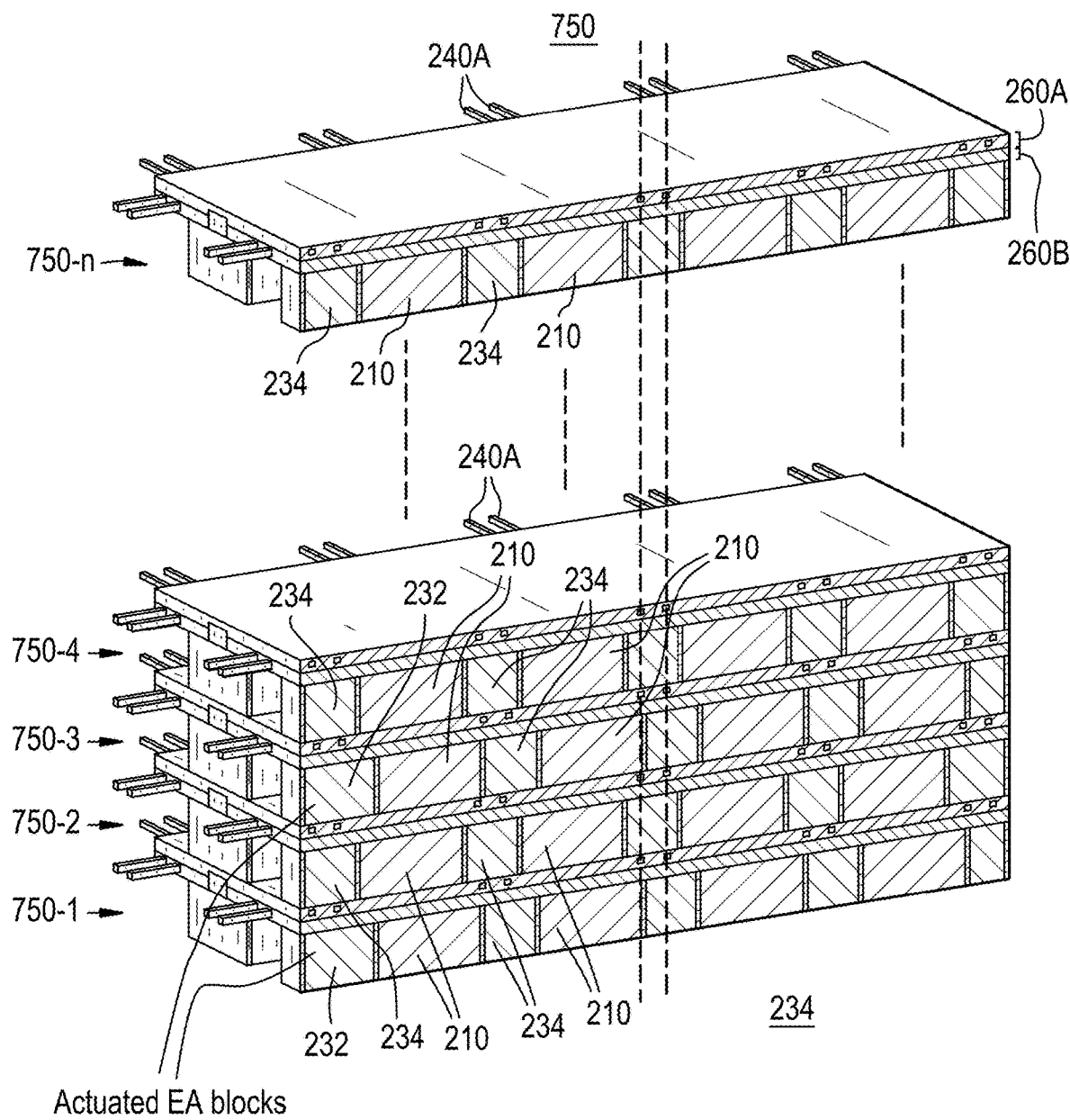
FIG. 7C is a diagram for illustrating actuated EA blocks of an EA-controlled multi-surface structure.

For an EA-controlled multi-surface structure including n stacked EA-controlled smart surfaces, such as the EA-controlled multi-surface structure 700, the number of combinations of achievable composite dielectric states is equal to 2n. For the case when all the individual layers have exactly the same composition and heights, the number of possible dielectric permittivity states drops to n+1. The different dielectric states can be achieved through selective actuation of EA blocks in an EA-controlled multi-surface structure. FIG. 7C is a diagram for illustrating actuated EA blocks of an EA-controlled multi-surface structure 750. FIG. C illustrates a perspective view of a cross section of an EA-controlled multi-surface structure which includes first through $n^{th}$ EA-controlled smart surfaces 750-1~750-n. As is also illustrated in FIG. 7C, the first and third EA-controlled smart surfaces 750-1 and 750-3 of the EA-controlled multi-surface structure 750 include actuated EA blocks 232 and unactuated EA blocks 234, while the second, fourth and $n^{th}$ EA-controlled smart surfaces 750-2, 750-4 and 750-n include unactuated EA blocks 234 and do not include actuated EA blocks 232.

The actuated EA blocks 232 may be EA blocks 230 that have been selectively actuated by the control circuitry 400 illustrated in FIG. 4. For example, the EA blocks may become actuated in response to the application of bias voltages for causing an EA bock to enter an actuated state, or, alternatively, due to the lack of an application of bias voltages for causing an EA block to enter an unactuated state. The unactuated EA blocks 234 may be EA blocks 230 that have not been actuated. For example, the EA blocks may be unactuated due to the lack of an application of bias voltages for causing an EA block to enter an actuated state, or, alternatively, in response to the application of a bias voltage for causing an EA block to enter an unactuated state. As is illustrated in FIG. 7C, in response to the actuated EA blocks 232 in the first and third EA-controlled smart surfaces 750-1 and 750-3 having been actuated, the dielectric tiles 210 of the first and third EA-controlled smart surfaces 750-1 and 750-3 are not vertically aligned with the dielectric tiles 210 of the second, fourth and $n^{th}$ EA-controlled smart surfaces 750-2, 750-4 and 750-n. Similarly, EA blocks (e.g., unactuated EA blocks 234) of the first and third EA-controlled smart surfaces 750-1 and 750-3 are not vertically aligned with EA blocks (e.g., unactuated EA blocks 234) of the second, fourth and $n^{th}$ EA-controlled smart surfaces 750-2, 750-4 and 750-n. Further, in the example illustrated in FIG. 7C, corresponding bias line pairs of each EA-controlled smart surface (i.e., 750-1-750-n) in the EA-controlled multi-surface structure 750 remain in vertical alignment with each other despite the presence of actuated EA blocks 242, as illustrated in in FIG. 7C with respect to Y-direction bias line pairs 240A.

According to at least some example embodiments any or all of the EA-controlled smart surfaces 200 and 500 of FIGS. 2A and 5A, and the EA-controlled multi-surface structures 600 and 700 of FIGS. 6A and 7A may operate in the manner discussed above with respect to the EA-controlled multi-surface structure 750 of FIG. 7C. Thus, according to at least some example embodiments, the actuation of one or more rows or columns of EA blocks in an EA-controlled smart surface (e.g., 200, 500, 600-1-600-n, 700-1-700-n, or 750-1-750-n) may cause EA blocks 230, dielectric tiles 210, bias plates 250, Y-direction sliding contacts 220A and/or X-direction sliding contacts 220B of the EA-controlled smart surface to shift, spatially, while the first and second upper layers 260A and 260B (and the Y-direction bias lines 240A and X-direction bias lines 240B supported by the first and second upper layers 260A and 260B) of the EA-controlled smart surface remain stationary. Further, according to at least some example embodiments, in the EA-controlled multi-surface structures 600 and 700 of FIGS. 6A and 7A, the bias line pairs (i.e., 740A and 740B) of the EA-controlled smart surfaces (600-1-600-n and 700-1-700-n) included in the EA-controlled multi-surface structures 600 and 700 may remain in vertical alignment with each other even when one or more EA blocks 230 is an actuated EA block 232, in the same manner shown in FIG. 7C with respect to the EA-controlled multi-surface structure 750.

According to at least some example embodiments, by selectively actuating one or more EA-controlled smart surfaces of an EA-controlled multi-surface structure, it is possible to fully discretize the dielectric permittivity of the EA-controlled multi-surface structure as a function of the transversal coordinates (i.e., x and y) to yield, εr=εr (x, y), where the input EM wave is assumed to propagate in the positive, z direction. If it is assumed that there is an elliptically polarized wave (which may be considered a most general case) given by f(x,y) incident on the surface of the EA-controlled smart surface 500 of FIG. 5 or the EA-controlled multi-surface structure 600, 700 or 750 of FIGS. 6A-7C, the output signal in the Fourier domain can be written in accordance with Expression (11):

$$g(x,y)=G(x,y)f(x,y). \quad (11)$$

For any elliptically polarized wave, the input signal can be decomposed into 2 orthogonal components, in accordance with Expression (12):

$$f(x,y)=f_1(x)+f_2(y), \quad (12)$$

which gives Expression (13):

$$g(x,y)=G(x,y)f_1(x)+G(x,y)f_2(y). \quad (13)$$

According to at least some example embodiments of the inventive concepts, the spatial impulse response, G(x,y), is obtained in accordance with a desired function the EA-controlled smart surface is expected to perform. For example, Expression (13) states that by controlling G(x,y), one is able to control the output signal. In turn, it was shown that G(x,y) is a function of the profile of the dielectric permittivity of the surface. Accordingly, the shape of the output EM signal may be controlled in accordance with pre-described mathematical functions by controlling the profile of the dielectric permittivity of the EA-controlled smart surface or EA-controlled multi-surface structure.

As an example, consider the case of an EA-controlled multi-surface structure including first and second instances of the EA-controlled smart surface 200 of FIGS. 2A-2D stacked on each other, as represented below by Table I and Table II. In Tables I and II, state "00" refers to EA blocks 230 of the first and second instances of the EA-controlled smart surface 200 being vertically aligned; state "11" refers to dielectric tiles 210 of the first and second instances of the EA-controlled smart surface 200 being vertically aligned; state "10" refers to dielectric tiles 210 of the second instance of the EA-controlled smart surface 200 being vertically overlapping with EA blocks 230 of the first instance of the EA-controlled smart surface 200; and state "01" refers to EA blocks 230 of the second instance of the EA-controlled smart surface 200 vertically overlapping with dielectric tiles 210 of the first instance of the EA-controlled smart surface 200.

Table I shows total dielectric permittivities, $\varepsilon_{r\_total}$, for states 00, 01, 10 and 11, where $\varepsilon_{r\_EA\_material}$=3.9 and $\varepsilon_{r\_diel\_tile}$=10, and that the respective heights of the first and second instances of the EA-controlled smart surface 200 are the same and equal to h=10 nm.

TABLE I

| State | 00 | 01 | 10 | 11 |
|---|---|---|---|---|
| $\varepsilon_{r\_total}$ | 3.9 | 5.61 | 5.61 | 10 |

Table II shows total dielectric permittivities, $\varepsilon_{r\_total}$, for states 00, 01, 10 and 11, where $\varepsilon_{r\_EA\_material}$=3.9 and $\varepsilon_{r\_diel\_tile}$=10, the height of the first instance of the EA-controlled smart surface 200 is h=2.5 nm, and the height of the second instance of the EA-controlled smart surface 200 is h=7.5 nm.

TABLE II

| State | 00 | 01 | 10 | 11 |
|---|---|---|---|---|
| $\varepsilon_{r\_total}$ | 3.9 | 4.6 | 7.19 | 10 |

According to at least some example embodiments, the states illustrated in Tables I and II represent a digitization method that is dependent on the heights of the individual EA-controlled smart surfaces of an EA-controlled multi-surface structure, and show that a variety of different dielectric states are achievable. Accordingly, the stacked individual EA-controlled smart surfaces in an EA-controlled multi-surface structure, together, can effectively behaves as a weighted binary system, where the weight of a bit is controlled by the pixel height (e.g., a EA-controlled smart surface height). Of course, depending on the accuracy of the mathematical functions an operator or designer of an EA-controlled multi-surface structure desires to implement, the EA-controlled multi-surface structure may have a stack of many individual EA-controlled smart surfaces, with many individual pixels (e.g., may individual EA-controlled smart surface heights).

For example, for the first order differentiation in the y-direction, the spatial impulse response may be represented by Expression (14):

$$\tilde{G}(x,y)=(i*y)/(W/2), \quad (14)$$

corresponding to a dielectric permittivity profile defined by Expression (15):

$$\varepsilon_r(y) = \frac{1}{jk_0\Delta}\ln\left(j\frac{2y}{W}\right). \quad (15)$$

It should be noted that achieving a monotonic function of Expression (15) may require a large or, alternatively, infinite number of "pixels." However, such precision may not be necessary. From the knowledge of EM simulators, the number of pixels per wavelength may be dependent on the accuracy. For example, it may be desirable to have up to 10 pixels per wavelength. An example process for designing an EA-controlled smart surface or EA-controlled multi-surface structure will now be discussed below with reference to FIG. 8.

Figure 8:
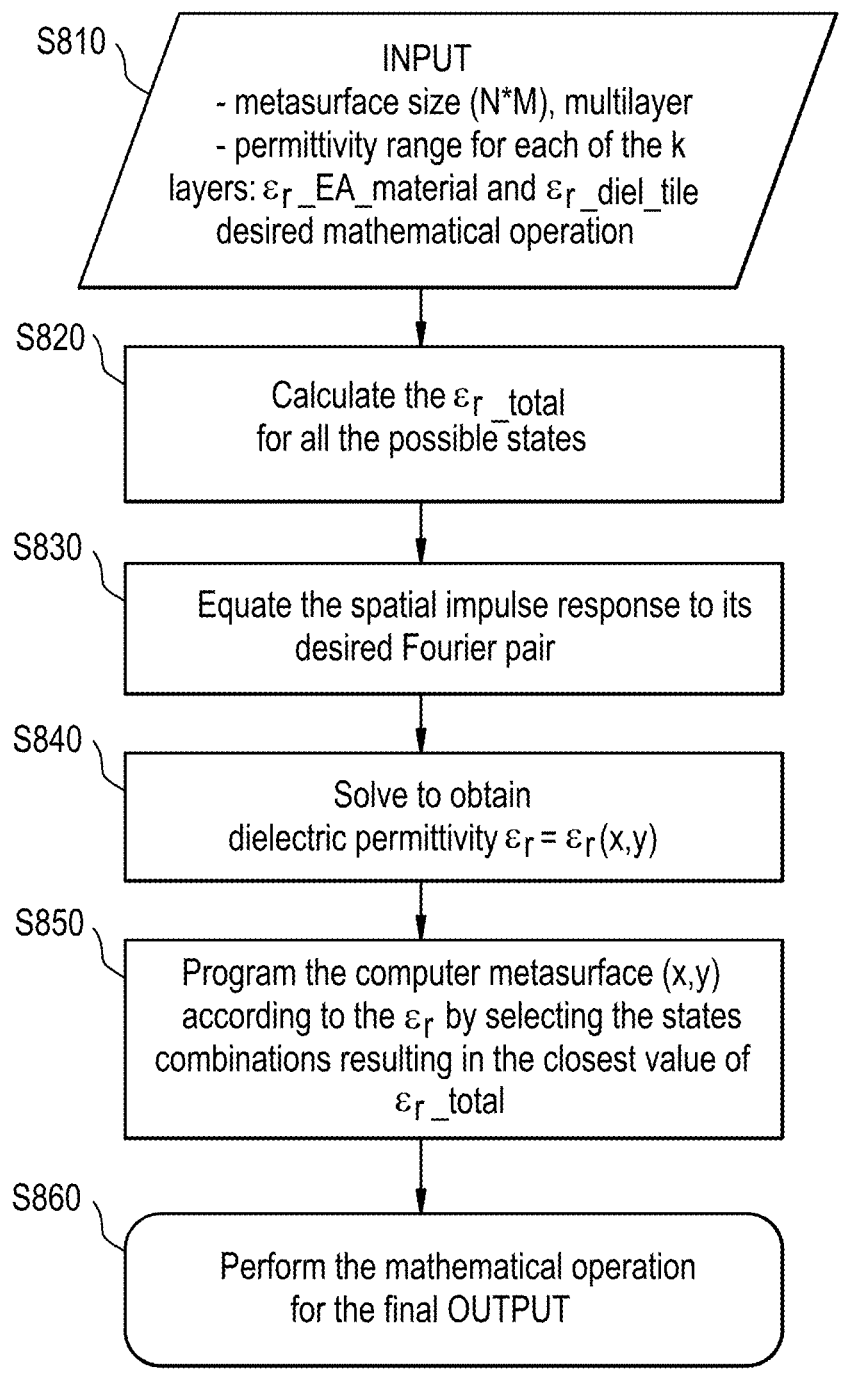
FIG. 8 illustrates an example algorithm for configuring an EA-controlled smart surface or EA-controlled multi-surface structure, according to at least some example embodiments.

FIG. 8 illustrates an example algorithm for configuring an EA-controlled smart surface or EA-controlled multi-surface structure, according to at least some example embodiments.

Referring to FIG. 8, in operation S810 inputs are provided to the algorithm. Inputs may include size parameters N, M and k where N and M may be metasurface size parameters (e.g., a number of columns, N, and rows, M, of an EA-controlled smart surface) and k is a total number of EA-controlled smart surfaces. For example, for a single EA-controlled smart surface, k would be 1, and for a EA-controlled multi-surface structure, k would be a positive integer greater than 1. The input to the algorithm may also include permittivity parameters such as EA block permittivity, $\varepsilon_{r\_EA\_material}$, and dielectric tile permittivity, $\varepsilon_{r\_diel\_tile}$. The aforementioned inputs may be chosen by a designer of the EA-controlled smart surface or EA-controlled multi-surface structure on the basis of the mathematical operations the designer wishes the EA-controlled smart surface or EA-controlled multi-surface structure to perform.

In operation S820, a total permittivity $\varepsilon_{r\_total}$ is determined for all possible states of the EA-controlled smart surface or EA-controlled multi-surface structure (for example, in the manner discussed above with respect to Expressions (7)-(10).

In operation S830, the spatial impulse response is equated to a corresponding desired Fourier pair, for example, in the example discussed above for differentiation with reference to Expressions (14) and (15). It will be understood that the spatial impulse response can be equated to a corresponding desired Fourier pair for operations other than differentiation including, for example, integration, the spatial impulse response for which is defined by Expression (16):

$$G(y)=(d/(j^*y)^n. \tag{16}$$

In operation S840, the equation obtained from completing operation S830 is solved to obtain dielectric permittivity $\varepsilon_r$.

In operation S850, the computer metasurface (e.g., the EA-controlled smart surface or EA-controlled multi-surface structure) is programmed in order to obtain the desired total permittivity values $\varepsilon_{r\_total}$ corresponding to the mathematical operation(s) a user of the computer metasurface wishes the computer metasurface to perform. Programming the computer metasurface includes using the control circuit 400 to apply, to the computer metasurface, the bias voltages corresponding to the desired physical arrangement of EA blocks and dielectric tiles in the EA-controlled smart surface(s) of the computer metasurface in order to achieve the desired mathematical function.

In operation S860, after an input EM wave incident on a surface of the computer metasurface is output as an output EM wave after having been transformed in accordance with the mathematical operation the computer metasurface was programmed to perform in operation S850.

Thus, the EA-controlled smart surface (e.g., 200 and 500) or EA-controlled multi-surface structure (e.g., 600, 700 and 750) according to at least some example embodiments may function as an analog computer capable of performing a variety of mathematical operations on wireless signals in the inherent, natural domain of the wireless signals, thus resulting in significantly more efficient computing.

Further, EA-controlled smart surfaces are discussed above (e.g., with reference to FIGS. 2A-8) primarily with respect to examples in which a single EM wave is impinging an EA-controlled smart surface or an EA-controlled multi-surface structure. However, according to at least some example embodiments, an EA-controlled smart surface such as the EA-controlled smart surfaces discussed above with reference to FIGS. 2A-8 may be formed to have a size which is larger than that of EM waves upon which the EA-controlled smart surface is intended to perform a desired signal processing function (e.g., a mathematical function). According to at least some example embodiments, an EA-controlled smart surface having a size which is larger than that of EM waves impinging the EA-controlled smart surface may be virtually spatially segmented thereby allowing for parallel individual processing of several (spatially separated) impinging EM waves either of same frequency and power level or different frequencies with the same or different power levels. For example, according to at least some example embodiments, in a scenario where a size of one or more of the n stacked EA-controlled smart surfaces 700-1~700-n of the EA-controlled multi-surface structure 700 (e.g., with respect to the x-y plane) is larger than a size of EM waves upon which the EA-controlled multi-surface structure 700 is to perform a desired signal processing function, the control circuitry 400 may control the n stacked EA-controlled smart surfaces 700-1~700-n in accordance with a virtual segmentation of one or more of the n stacked EA-controlled smart surfaces 700-1~700-n such that the EA-controlled multi-surface structure 700 performs parallel individual processing of several spatially separated EM waves impinging the EA-controlled multi-surface structure 700. According to at least some example embodiments, the virtual segmentation may define a plurality of spatial regions, and each spatial region may correspond to an individual EM wave to be processed by the EA-controlled multi-surface structure 700.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided above to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

As discussed herein, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at, for example, existing UE, base stations, eNBs, RRHs, gNBs, femto base stations, network controllers, computers, Central Units (CUs), ng-eNBs, other radio access or backhaul network elements, or the like. Such existing hardware may be processing or control circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium," "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine-readable mediums for storing information. The term "computer readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks. For example, as mentioned above, according to one or more example embodiments, at least one memory may include or store computer program code, and the at least one memory and the computer program code may be configured to, with at least one processor, cause a network element or network device to perform the necessary tasks. Additionally, the processor, memory and example algorithms, encoded as computer program code, serve as means for providing or causing performance of operations discussed herein.

A code segment of computer program code may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable technique including memory sharing, message passing, token passing, network transmission, etc.

The terms "including" and/or "having," as used herein, are defined as comprising (i.e., open language). The term "coupled," as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

According to example embodiments, UE, base stations, eNBs, RRHs, gNBs, femto base stations, network controllers, computers, Central Units (CUs), ng-eNBs, other radio access or backhaul network elements, or the like, may be (or include) hardware, firmware, hardware executing software or any combination thereof. Such hardware may include processing or control circuitry such as, but not limited to, one or more processors, one or more CPUs, one or more controllers, one or more ALUs, one or more DSPs, one or more microcomputers, one or more FPGAs, one or more SoCs, one or more PLUs, one or more microprocessors, one or more ASICs, or any other device or devices capable of responding to and executing instructions in a defined manner.

Benefits, other advantages, and solutions to problems have been described above with regard to specific embodiments of the invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

What is claimed is:

1. An apparatus comprising:
   a dielectric tile array including a plurality of non-electroactive dielectric tiles; and
   a plurality of electroactive (EA) material blocks configured to expand or contract in response to being actuated by an application of an actuation voltage.

2. The apparatus of claim 1, further comprising:
   a plurality of bias plates,
   wherein, for each EA material block among the plurality of EA material blocks, two bias plates among the plurality of bias plates are affixed to two opposite sides the EA material block, respectively.

3. The apparatus of claim 2, wherein, for each EA material block among the plurality of EA material blocks, at least one of the two bias plates affixed to the EA material block is affixed to a side of a non-electroactive dielectric tile from among the plurality of non-electroactive dielectric tiles.

4. The apparatus of claim 3, further comprising:
   a plurality of sliding contacts,
   wherein, for each EA material block among the plurality of EA material blocks, two sliding contacts from among the plurality of sliding contacts are affixed, respectively, to the two bias plates that are affixed the EA material block.

5. The apparatus of claim 4, further comprising:
   a plurality of bias line pairs,
   wherein, for each EA material block among the plurality of EA material blocks, the two sliding contacts connected to the EA material block via the two bias plates affixed to the EA material block contact the two bias lines of a bias line pair from among the plurality of bias line pairs.

6. The apparatus of claim 5, wherein, for each EA material block among the plurality of EA material blocks,
   the two bias lines contacting the two sliding contacts connected to the EA material block via the two bias plates affixed to the EA material block are configured to supply the actuation voltage to the EA material block.

7. The apparatus of claim 6, wherein, at least a first EA material block from among the plurality of EA material blocks is configured such that, in response to the application of the actuation voltage to the first EA material block, the EA material block expands or contracts such that a distance between the two bias plates affixed to the first EA material block increases or decreases.

8. The apparatus of claim 7, wherein, at least the first EA material block is further configured such that, in response to the application of the actuation voltage to the first EA material block, the EA material block expands or contracts such that the non-electroactive dielectric tile affixed to at least one of the bias plates affixed to the first EA material block changes position relative to the two bias lines contacting the two sliding contacts connected to the first EA material block via the two bias plates affixed to the first EA material block.

9. A multi-surface structure comprising:
   a plurality of smart surface layers stacked on each other, each smart surface layer including,
      a dielectric tile array including a plurality of non-electroactive dielectric tiles; and
      a plurality of electroactive (EA) material blocks configured to expand or contract in response to being actuated by an application of an actuation voltage.

10. The multi-surface structure of claim 9 further comprising:
    control circuitry configured to control the plurality of smart surface layers.

11. The multi-surface structure of claim 10, wherein the control circuitry is configured to control the plurality of smart surface layers to perform a first signal processing operation on an electromagnetic (EM) wave that impinges the plurality of smart surface layers.

12. The multi-surface structure of claim 11, wherein the first signal processing operation is a differentiation operation or an integration operation.

13. The multi-surface structure of claim 11, wherein the control circuitry is configured to control the plurality of smart surface layers to perform the first signal processing operation by selectively actuating EA material blocks selected from among the plurality of EA material blocks of one or more of the plurality of smart surface layers.

14. The multi-surface structure of claim 13, wherein the control circuitry is configured to selectively actuate the selected EA material blocks by selectively applying bias voltages to the selected EA material blocks.

15. The multi-surface structure of claim 10, wherein the control circuitry is configured to control the plurality of smart surface layers in accordance with a virtual segmentation of one or more of the plurality of smart surface layers such that the plurality of smart surface layers performs parallel individual processing of several spatially separated EM waves that impinge the plurality of smart surface layers.

16. The multi-surface structure of claim 9, further comprising:
    a plurality of bias plates,
    wherein, for each EA material block among the plurality of EA material blocks of at least one smart surface layer from among the plurality of smart surface layers, two bias plates among the plurality of bias plates are affixed to two opposite sides the EA material block, respectively.

17. The multi-surface structure of claim 16, wherein, for each EA material block among the plurality of EA material blocks of the at least one smart surface layer, at least one of the two bias plates affixed to the EA material block is affixed to a side of a non-electroactive dielectric tile from among the plurality of non-electroactive dielectric tiles of the at least one smart surface layer.

18. The multi-surface structure of claim 17, further comprising:
    a plurality of sliding contacts,
    wherein, for each EA material block among the plurality of EA material blocks of the at least one smart surface layer, two sliding contacts from among the plurality of sliding contacts are affixed, respectively, to the two bias plates that are affixed the EA material block.

19. The multi-surface structure of claim 18, further comprising:
    a plurality of bias line pairs,
    wherein, for each EA material block among the plurality of EA material blocks of the at least one smart surface layer, the two sliding contacts connected to the EA material block via the two bias plates affixed to the EA material block contact the two bias lines of a bias line pair from among the plurality of bias line pairs.

20. The multi-surface structure of claim 19, wherein, for each EA material block among the plurality of EA material blocks of the at least one smart surface layer, the two bias lines contacting the two sliding contacts connected to the EA material block via the two bias plates affixed to the EA material block are configured to supply the actuation voltage to the EA material block.

\* \* \* \* \*